United States Patent
Kitagawa et al.

(10) Patent No.: US 10,748,939 B2
(45) Date of Patent: Aug. 18, 2020

(54) SEMICONDUCTOR DEVICE FORMED BY OXIDE SEMICONDUCTOR AND METHOD FOR MANUFACTURING SAME

(71) Applicant: SHARP KABUSHIKI KAISHA, Sakai, Osaka (JP)

(72) Inventors: Hideki Kitagawa, Sakai (JP); Tohru Daitoh, Sakai (JP); Hajime Imai, Sakai (JP); Hisao Ochi, Sakai (JP); Tetsuo Fujita, Sakai (JP); Tetsuo Kikuchi, Sakai (JP); Shingo Kawashima, Sakai (JP); Masahiko Suzuki, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/212,599

(22) Filed: Dec. 6, 2018

(65) Prior Publication Data

US 2019/0109159 A1    Apr. 11, 2019

Related U.S. Application Data

(63) Continuation of application No. 15/531,411, filed as application No. PCT/JP2015/082539 on Nov. 19, 2015, now abandoned.

(30) Foreign Application Priority Data

Nov. 28, 2014    (JP) .................................. 2014-242537

(51) Int. Cl.
*H01L 27/12* (2006.01)
*G02F 1/1343* (2006.01)
(Continued)

(52) U.S. Cl.
CPC ........ *H01L 27/1225* (2013.01); *G02F 1/1343* (2013.01); *H01L 21/28* (2013.01);
(Continued)

(58) Field of Classification Search
CPC ......... H01L 2924/0002; H01L 2924/00; H01L 21/28; H01L 21/283; H01L 21/306;
(Continued)

(56) References Cited

U.S. PATENT DOCUMENTS 5,657,100 A * 8/1997 Yamamoto ........... G03B 27/735
                                                       349/41
6,043,511 A * 3/2000 Kim .................... H01L 27/1288
                                                       257/59
(Continued)

FOREIGN PATENT DOCUMENTS

CN        103946742 A    7/2014
CN        104073803 A    10/2014
(Continued)

OTHER PUBLICATIONS

Final Rejection dated Jan. 30, 2019 for U.S. Appl. No. 15/531,420.
(Continued)

*Primary Examiner* — Mohammed Shamsuzzaman
(74) *Attorney, Agent, or Firm* — ScienBiziP, P.C.

(57) ABSTRACT

A semiconductor device (100A) is provided with: a gate electrode (3); an oxide semiconductor layer (5); a thin-film transistor (101) including a gate insulating layer (4), a source electrode (7S), and a drain electrode (7D); an inter-layer insulating layer (11) arranged so as to cover the thin-film transistor (101) and come into contact with a channel area (5c) of the thin-film transistor (101); and a transparent electroconductive layer (19) arranged on the inter-layer insulating layer (11), the source electrode (7S) and the drain electrode (7D) each having a copper layer (7a), and the device being further provided with a copper oxide film (8) arranged between the source and drain electrodes and the inter-layer insulating layer (11). The inter-layer insulating layer (11) covers the drain electrode (7D) with the copper oxide film (8) interposed therebetween. The transparent (Continued)

electroconductive layer (19) is directly connected to the copper layer (7a) of the drain electrode (7D) inside a contact hole (CH1) formed in the inter-layer insulating layer (11), without the copper oxide film (8) being interposed therebetween.

11 Claims, 23 Drawing Sheets

(51) Int. Cl.
| | |
|---|---|
| H01L 21/28 | (2006.01) |
| H01L 21/283 | (2006.01) |
| H01L 21/306 | (2006.01) |
| H01L 23/532 | (2006.01) |
| H01L 21/768 | (2006.01) |
| H01L 29/417 | (2006.01) |
| H01L 29/786 | (2006.01) |
| H01L 23/544 | (2006.01) |
| H01L 29/66 | (2006.01) |
| G02F 1/1368 | (2006.01) |

(52) U.S. Cl.
CPC .......... *H01L 21/283* (2013.01); *H01L 21/306* (2013.01); *H01L 21/768* (2013.01); *H01L 23/532* (2013.01); *H01L 23/53228* (2013.01); *H01L 23/53257* (2013.01); *H01L 23/544* (2013.01); *H01L 27/124* (2013.01); *H01L 27/1248* (2013.01); *H01L 29/41733* (2013.01); *H01L 29/66969* (2013.01); *H01L 29/7869* (2013.01); *H01L 29/78693* (2013.01); *G02F 1/1368* (2013.01); *H01L 2223/54426* (2013.01); *H01L 2924/0002* (2013.01)

(58) Field of Classification Search
CPC ......... H01L 21/768; H01L 2223/54426; H01L 23/532; H01L 23/53228; H01L 23/53257; H01L 23/544; H01L 27/1225; H01L 27/124; H01L 27/1248; H01L 29/41733; H01L 29/66969; H01L 29/7869; H01L 29/78693; G02F 1/1343; G02F 1/1368
See application file for complete search history.

(56) References Cited

U.S. PATENT DOCUMENTS

| | | | | |
|---|---|---|---|---|
| 6,682,961 | B1* | 1/2004 | Kim | H01L 27/1288 |
| | | | | 438/149 |
| 6,992,364 | B2* | 1/2006 | Yoo | G02F 1/1368 |
| | | | | 257/522 |
| 9,219,164 | B2 | 12/2015 | Yamazaki | |
| 2002/0034874 | A1 | 3/2002 | Aoki | |
| 2003/0111735 | A1 | 6/2003 | Lee | |
| 2004/0183955 | A1* | 9/2004 | Souk | G02F 1/13458 |
| | | | | 349/43 |
| 2005/0260804 | A1* | 11/2005 | Kang | H01L 21/76804 |
| | | | | 438/164 |
| 2007/0164667 | A1* | 7/2007 | Ha | H01L 27/3244 |
| | | | | 313/504 |
| 2008/0108229 | A1* | 5/2008 | Tanaka | B23K 26/0613 |
| | | | | 438/795 |
| 2009/0191654 | A1* | 7/2009 | Yu | B29D 11/00634 |
| | | | | 438/29 |
| 2009/0280597 | A1* | 11/2009 | Wijekoon | H01L 21/30608 |
| | | | | 438/71 |
| 2010/0244032 | A1* | 9/2010 | Yun | C22C 21/00 |
| | | | | 257/57 |
| 2011/0012112 | A1 | 1/2011 | Yamazaki et al. | |
| 2011/0127524 | A1 | 6/2011 | Yamazaki et al. | |
| 2011/0212569 | A1 | 9/2011 | Yamazaki et al. | |
| 2011/0227085 | A1* | 9/2011 | Nakamura | G02F 1/133502 |
| | | | | 257/59 |
| 2012/0018720 | A1 | 1/2012 | Park et al. | |
| 2012/0133873 | A1 | 5/2012 | Park et al. | |
| 2012/0138922 | A1 | 6/2012 | Yamazaki et al. | |
| 2013/0032794 | A1 | 2/2013 | Lee et al. | |
| 2013/0048994 | A1 | 2/2013 | Choi et al. | |
| 2013/0122323 | A1* | 5/2013 | Miki | C22C 9/00 |
| | | | | 428/632 |
| 2013/0140553 | A1 | 6/2013 | Yamazaki et al. | |
| 2013/0260497 | A1 | 10/2013 | Ahn et al. | |
| 2013/0320334 | A1 | 12/2013 | Yamazaki et al. | |
| 2014/0034947 | A1* | 2/2014 | Moriguchi | H01L 29/7869 |
| | | | | 257/43 |
| 2014/0091306 | A1 | 4/2014 | Miki et al. | |
| 2014/0159034 | A1 | 6/2014 | Yang | |
| 2014/0167034 | A1 | 6/2014 | Liu et al. | |
| 2014/0175423 | A1 | 6/2014 | Jeong et al. | |
| 2014/0286076 | A1 | 9/2014 | Aoki et al. | |
| 2015/0168758 | A1 | 6/2015 | Nakata et al. | |
| 2015/0179809 | A1 | 6/2015 | Liu et al. | |
| 2016/0027854 | A1 | 1/2016 | Ku | |
| 2016/0133681 | A1* | 5/2016 | Nam | H01L 51/5265 |

FOREIGN PATENT DOCUMENTS

| | | |
|---|---|---|
| JP | 2000-114368 A | 4/2000 |
| JP | 2003-197739 A | 7/2003 |
| JP | 2011-044699 A | 3/2011 |
| JP | 2011-135061 A | 7/2011 |
| JP | 2011-199272 A | 10/2011 |
| JP | 2012-027159 A | 2/2012 |
| JP | 2012-134475 A | 7/2012 |
| JP | 2012-243779 A | 12/2012 |
| JP | 2013-138188 A | 7/2013 |
| JP | 2014-007399 A | 1/2014 |
| JP | 2014-209727 A | 11/2014 |
| WO | 2016084698 A1 | 6/2016 |

OTHER PUBLICATIONS

Requirement for Restriction/Election dated Jan. 18, 2018 in the parent U.S. Appl. No. 15/531,411.
Non-Final Rejection dated Jul. 25, 2018 against U.S. Appl. No. 15/531,420.
Non-Final Rejection dated May 11, 2018 for U.S. Appl. No. 15/531,411.
Co-pending letter regarding related U.S. Appl. No. 15/531,420 and U.S. Appl. No. 15/531,411, dated Aug. 17, 2017.
Final Rejection dated Sep. 26, 2018 for U.S. Appl. No. 15/531,411.

* cited by examiner

FIG. 1
(a)
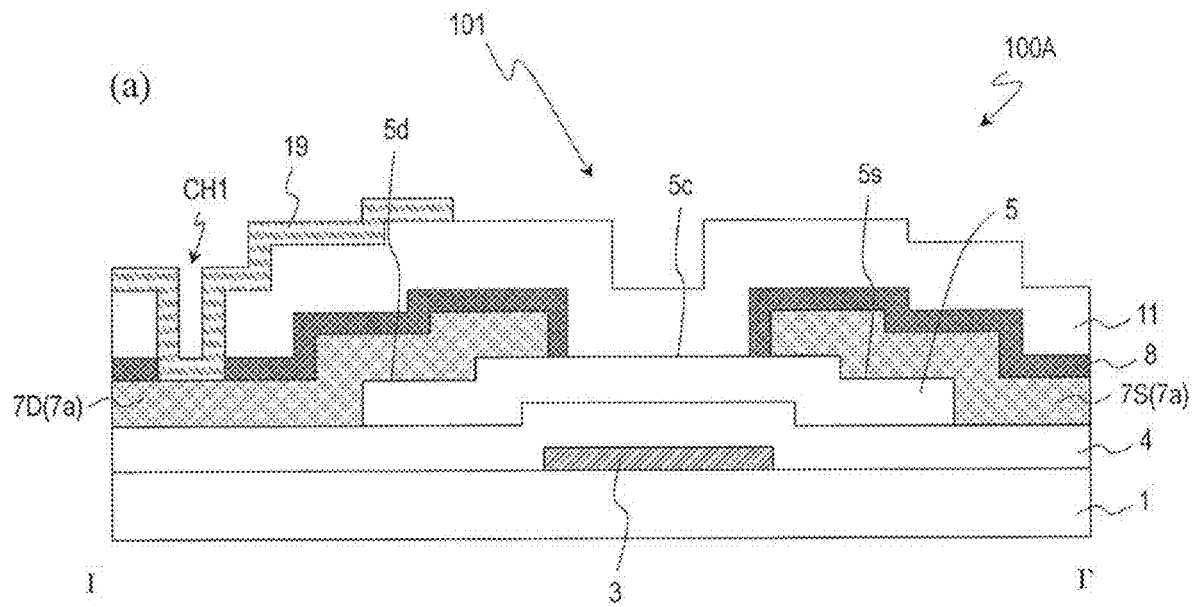
(b)
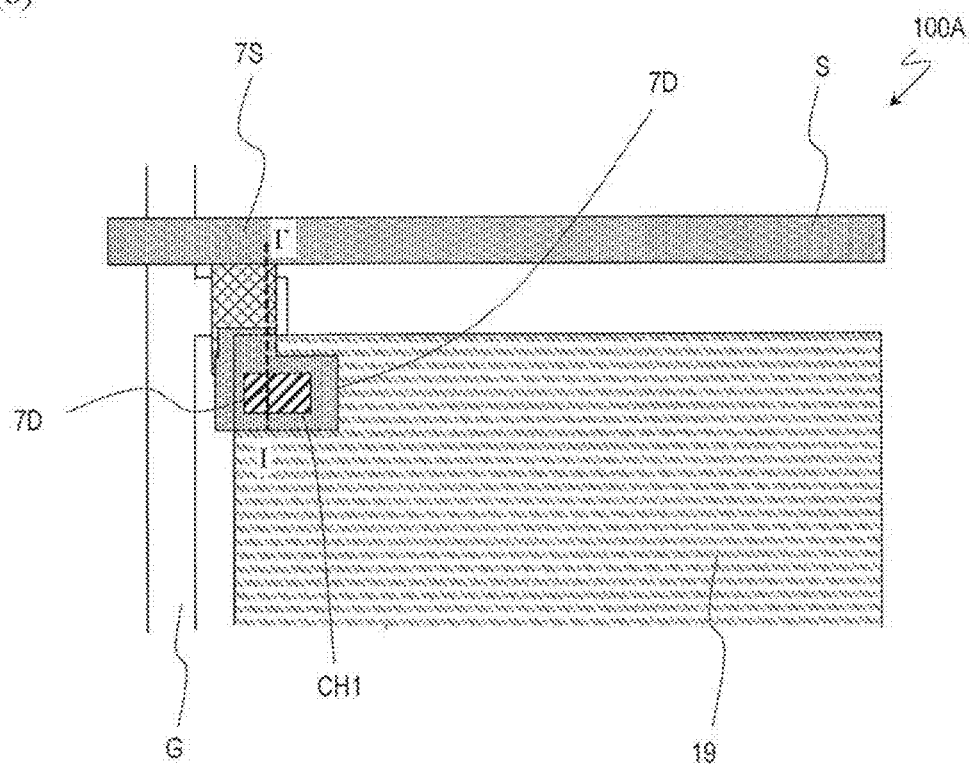

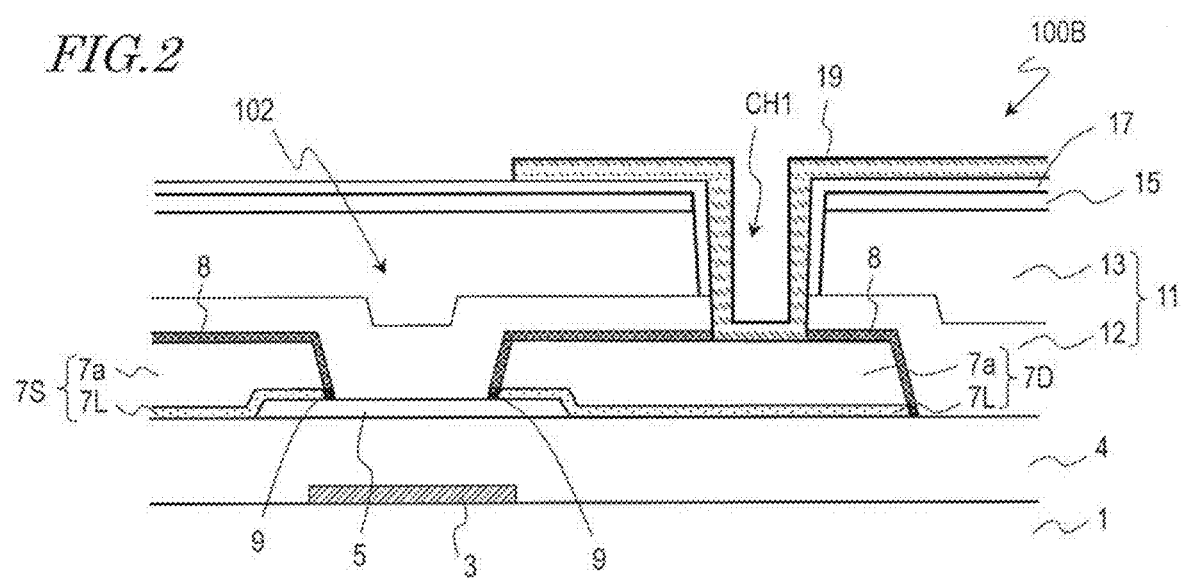
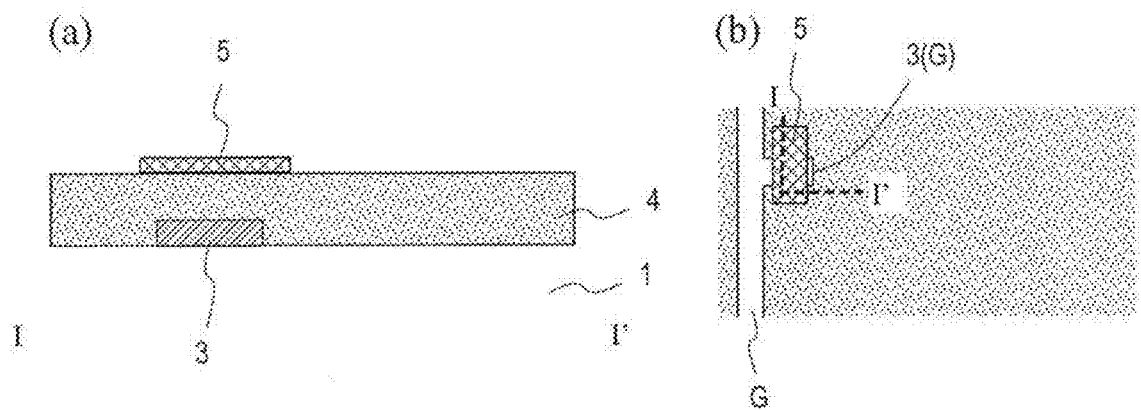
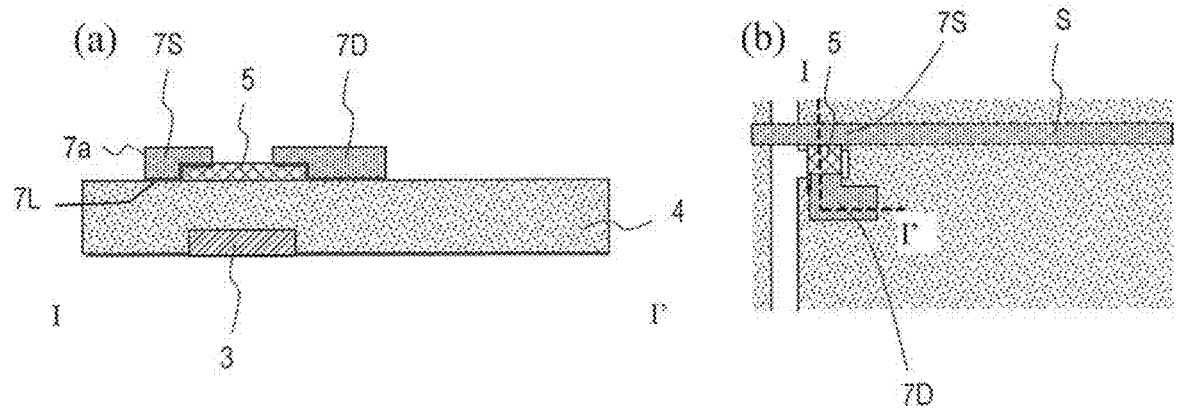

FIG.8
(a)
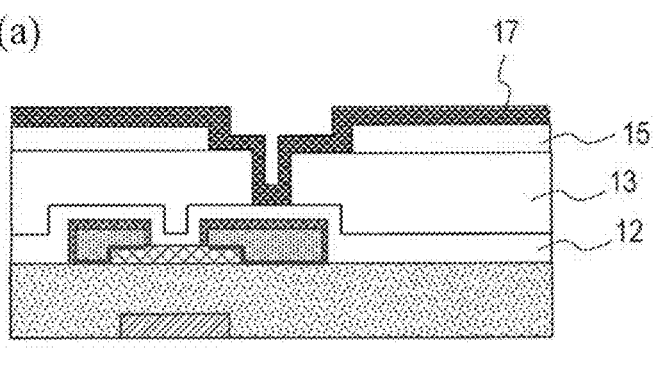
(b)
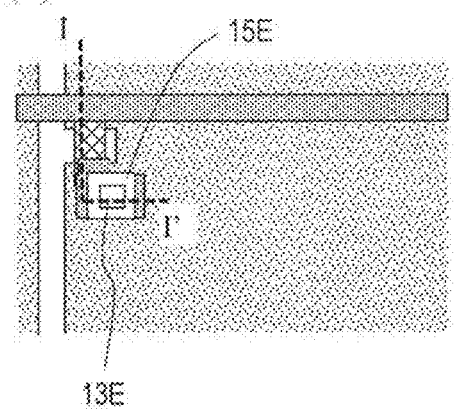

FIG.9
(a)
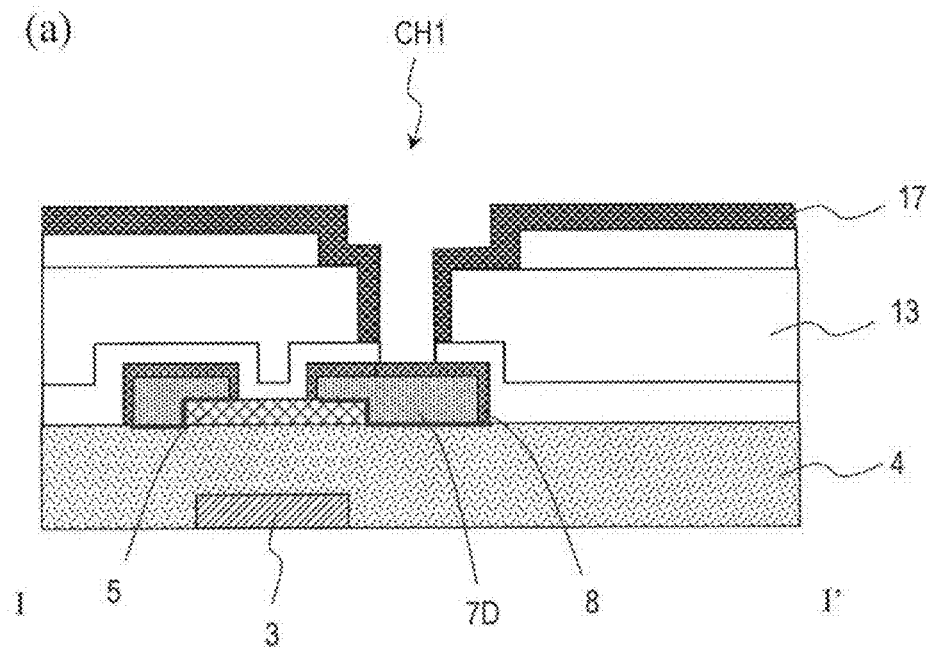
(b)
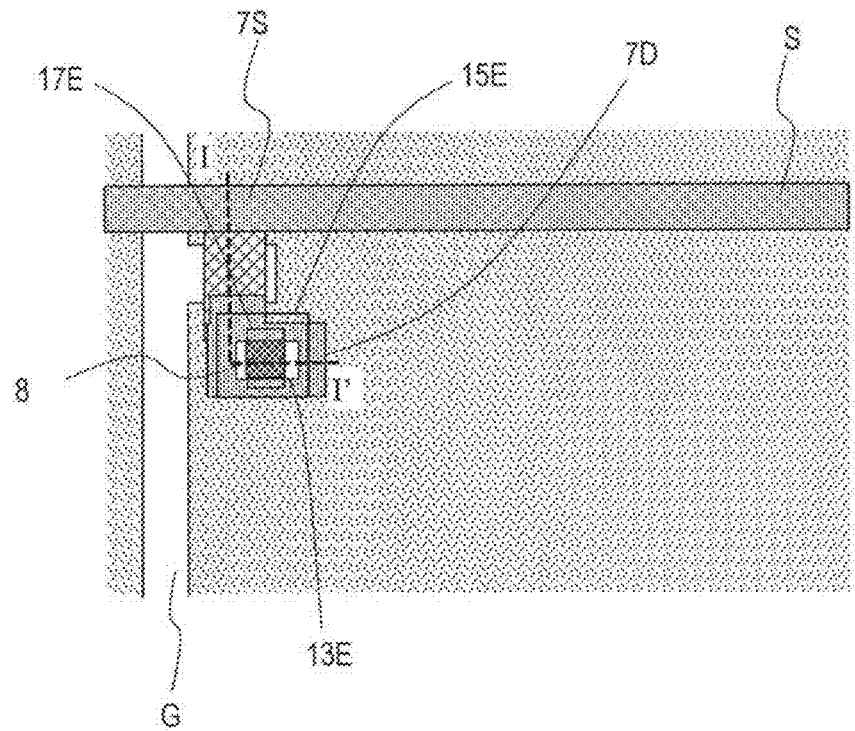

FIG. 10
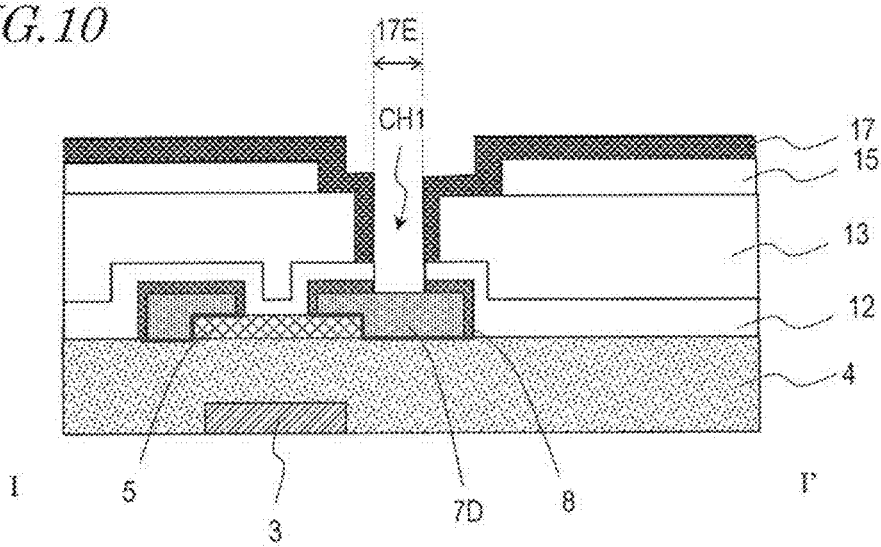
(a)
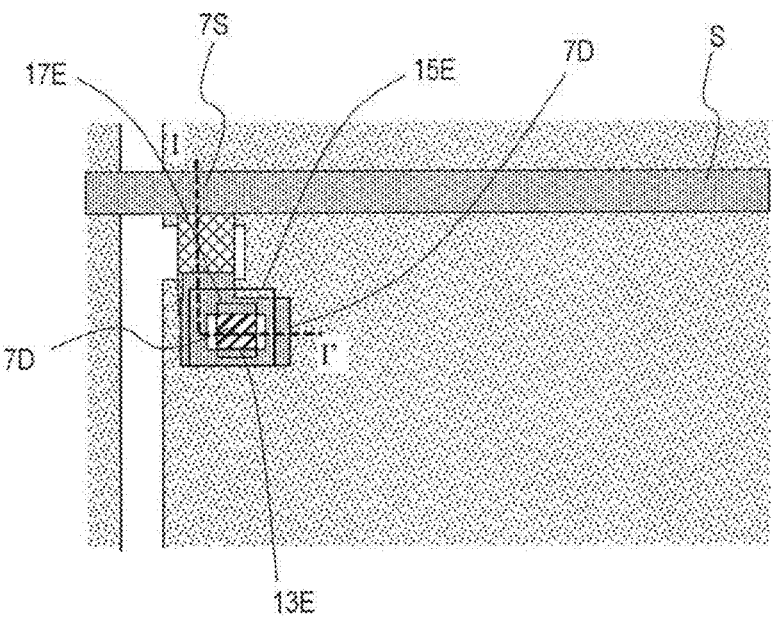
(b)
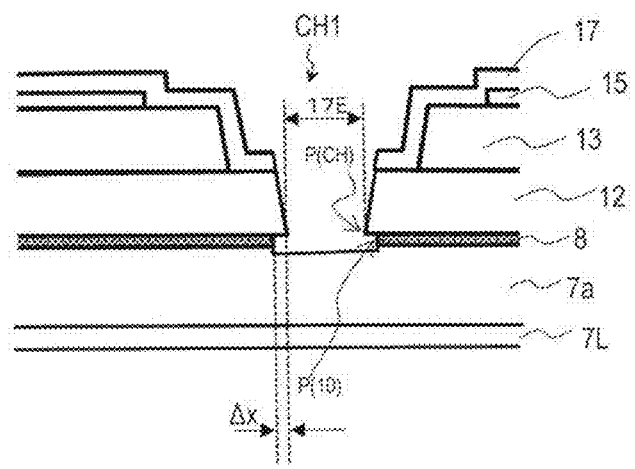
(c)

FIG.11
(a)
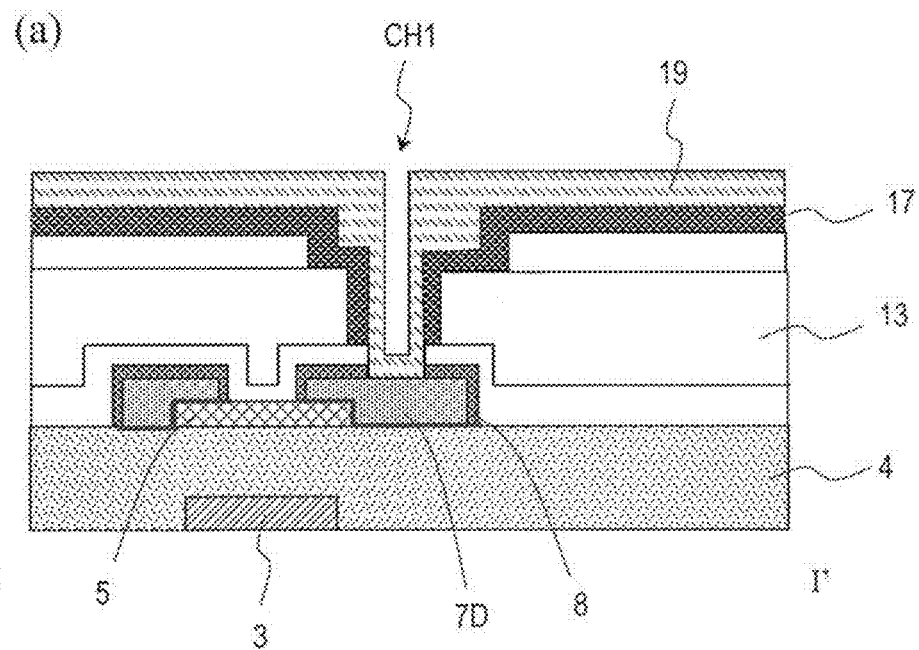
(b)
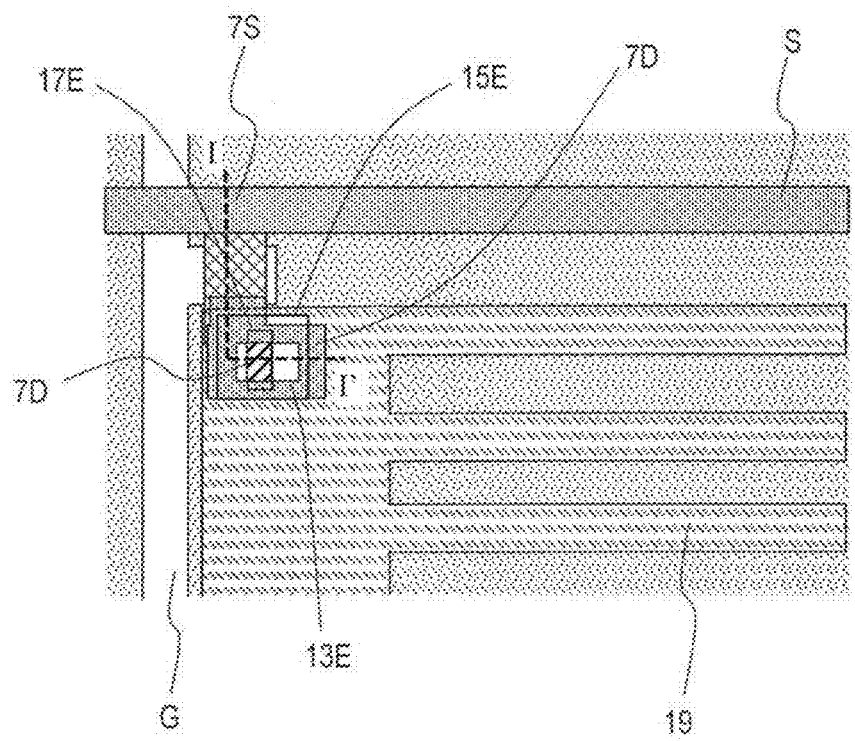

FIG.15
(a)
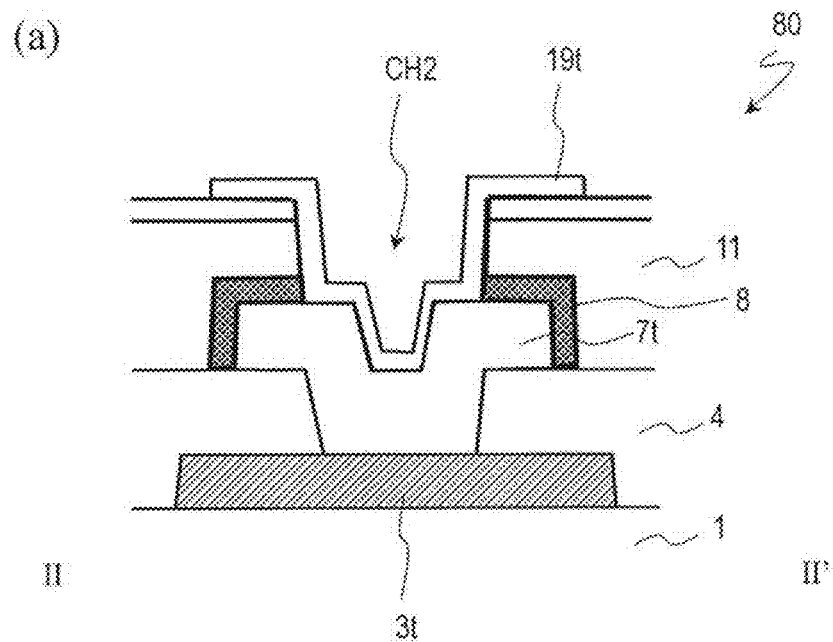
(b)
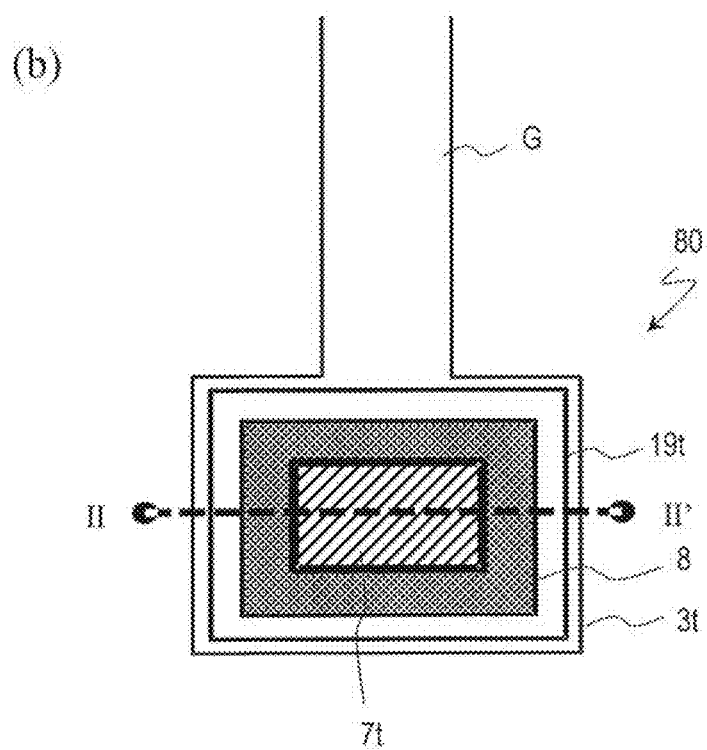

FIG.16
(a)
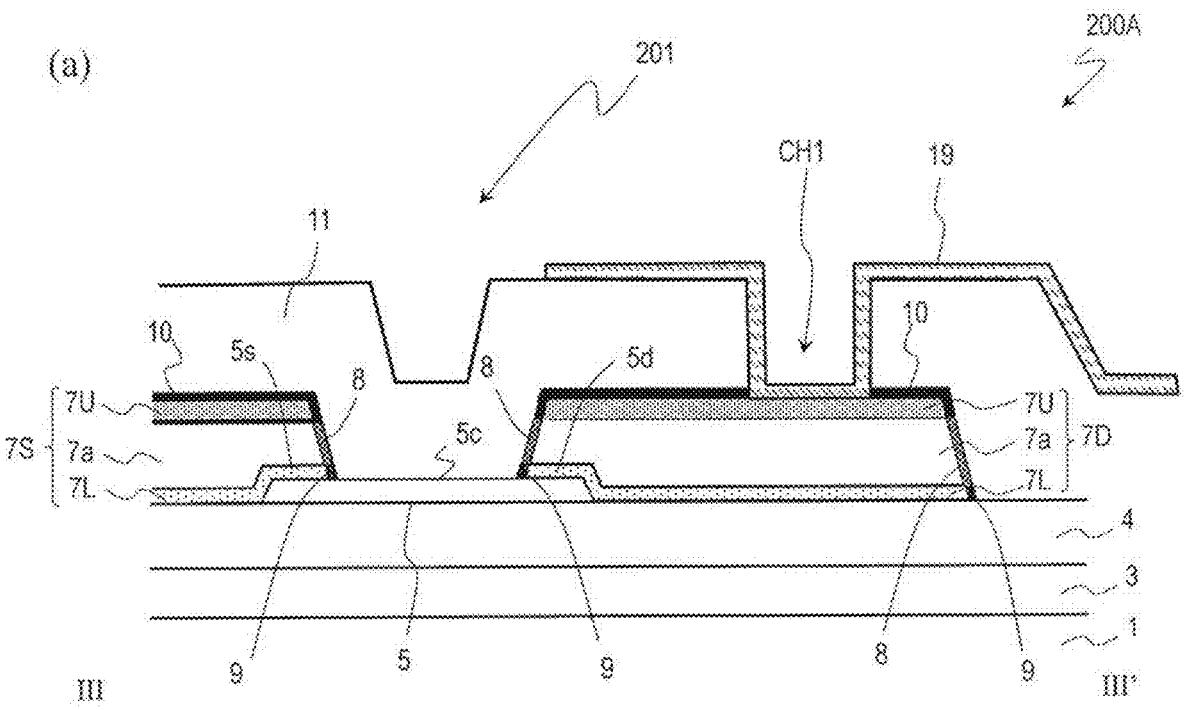
(b)
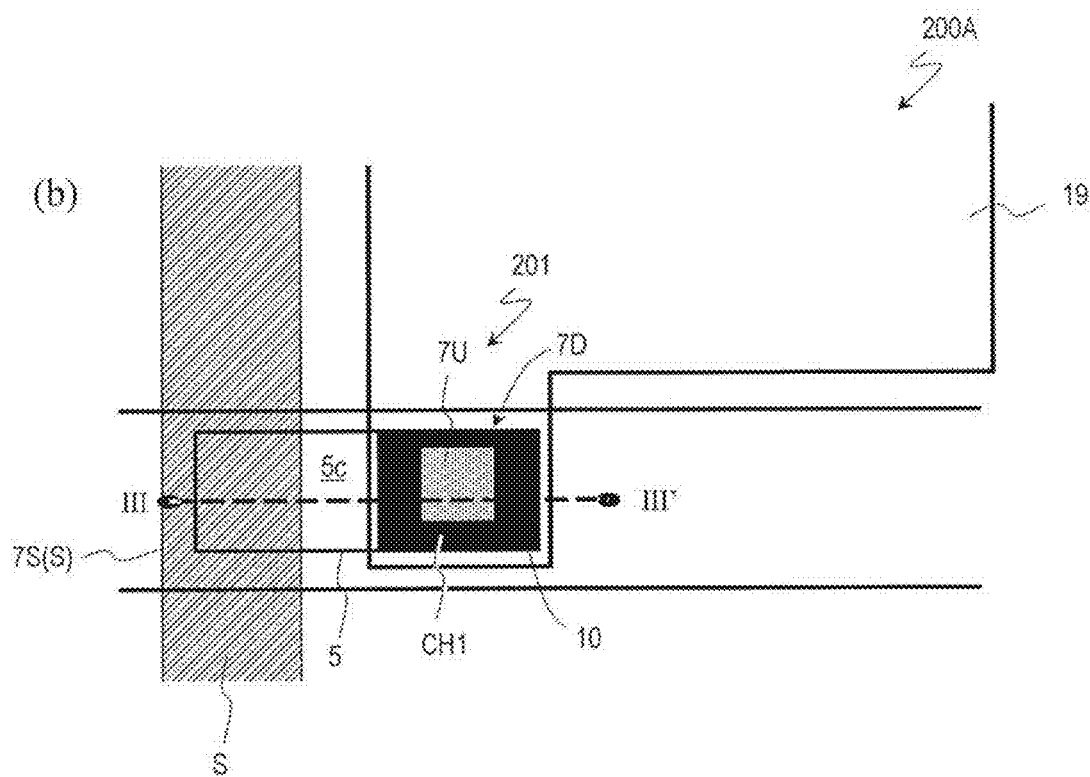

FIG.18
(a)
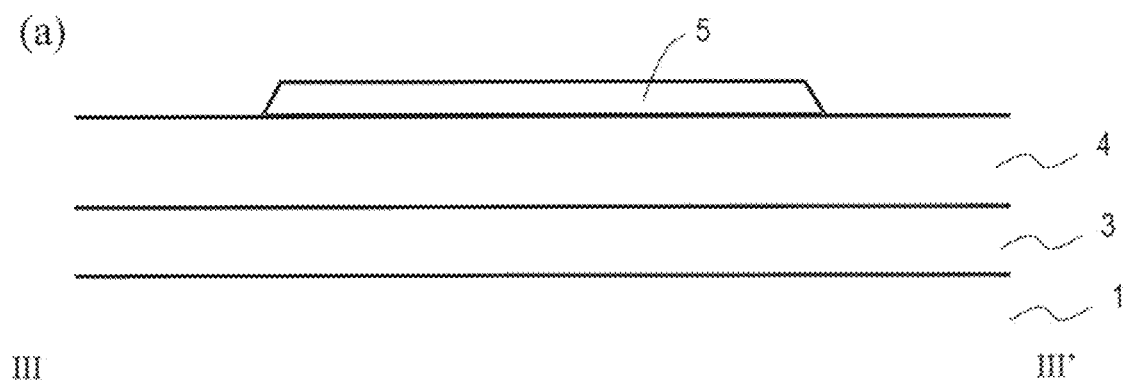
(b)
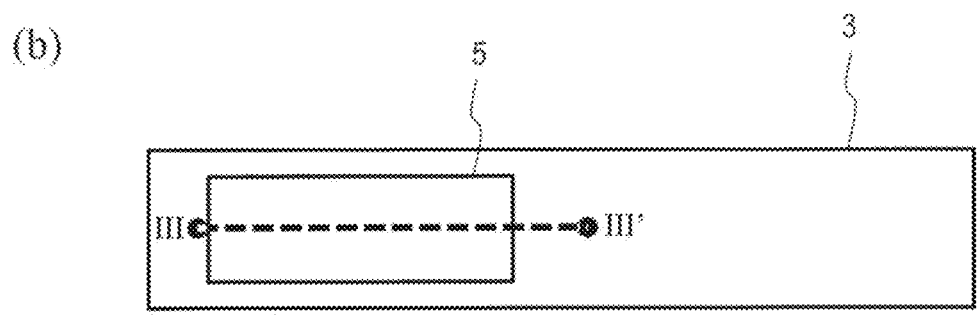

FIG.19
(a)
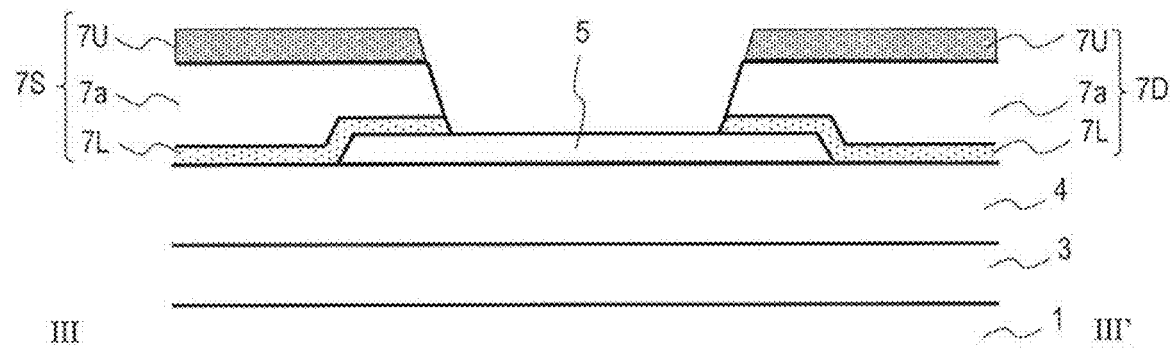
(b)
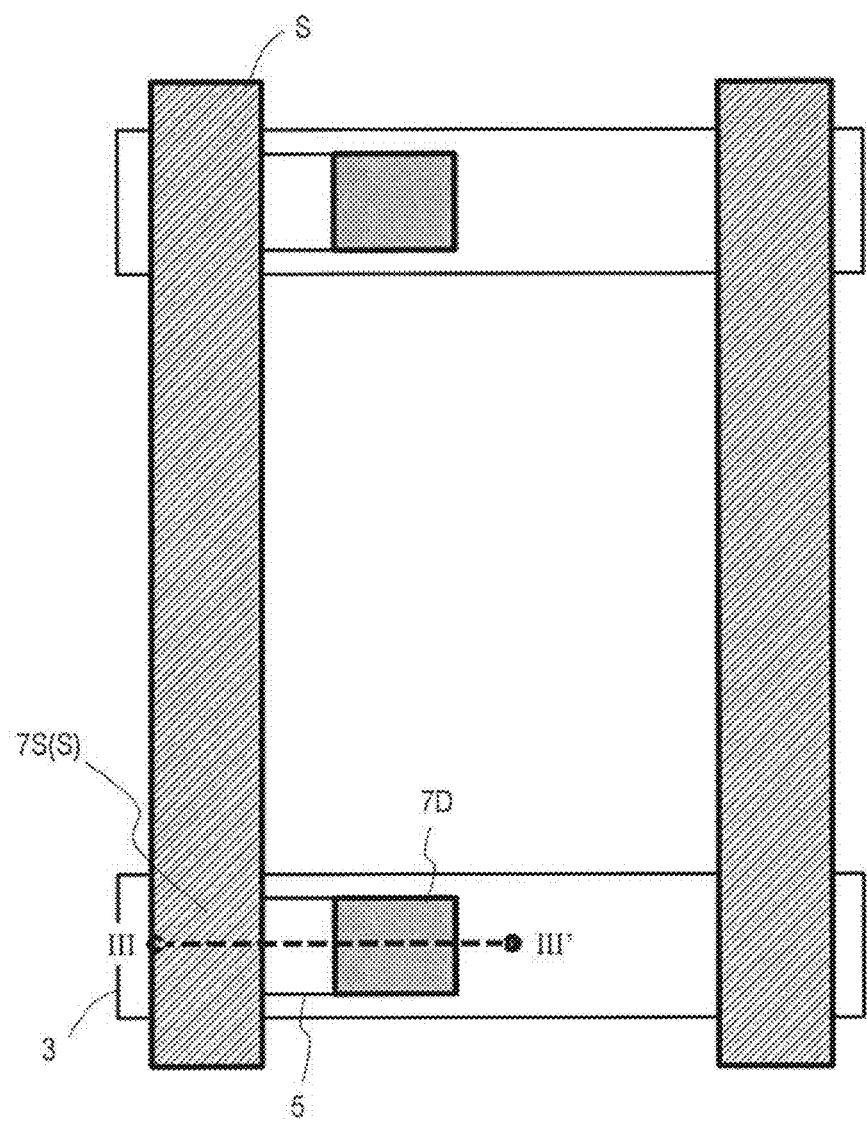

FIG.20
(a)
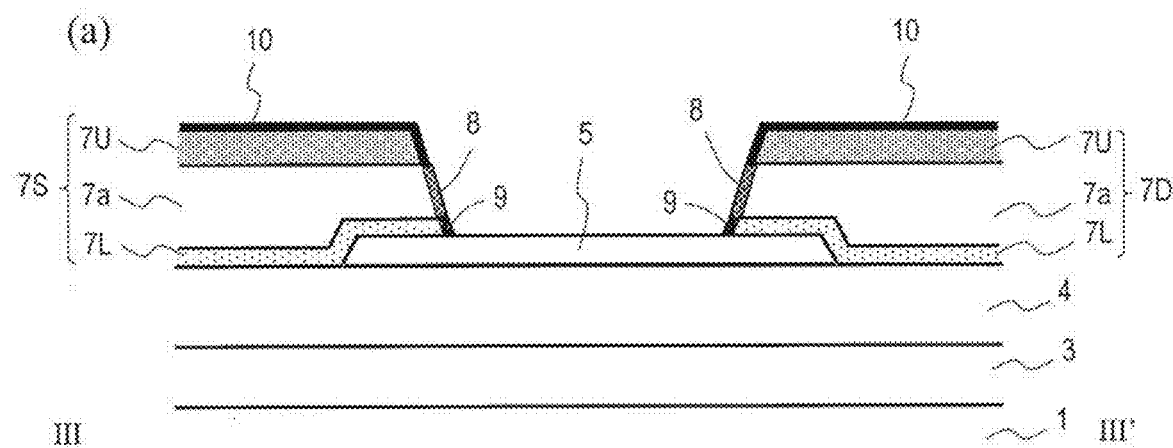
(b)
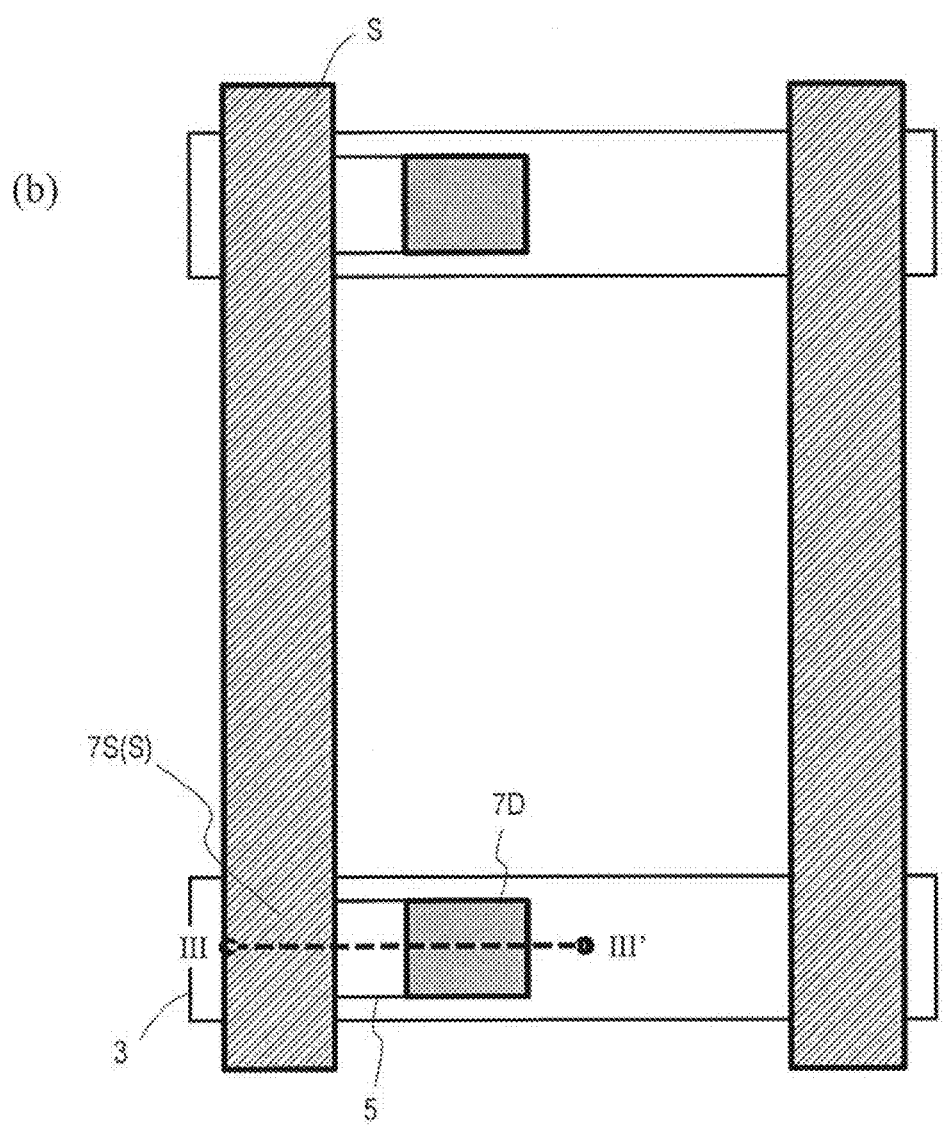

FIG.21
(a)
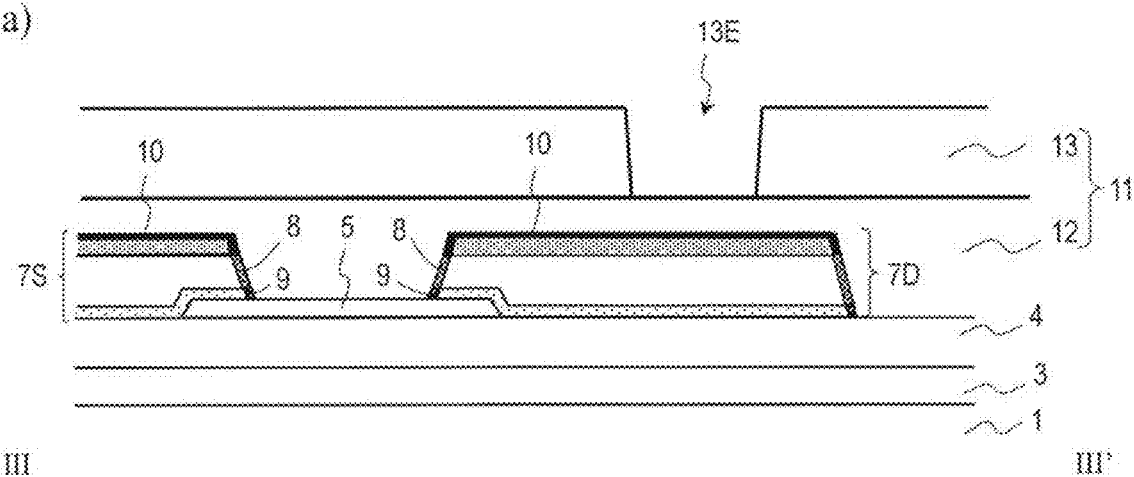
(b)
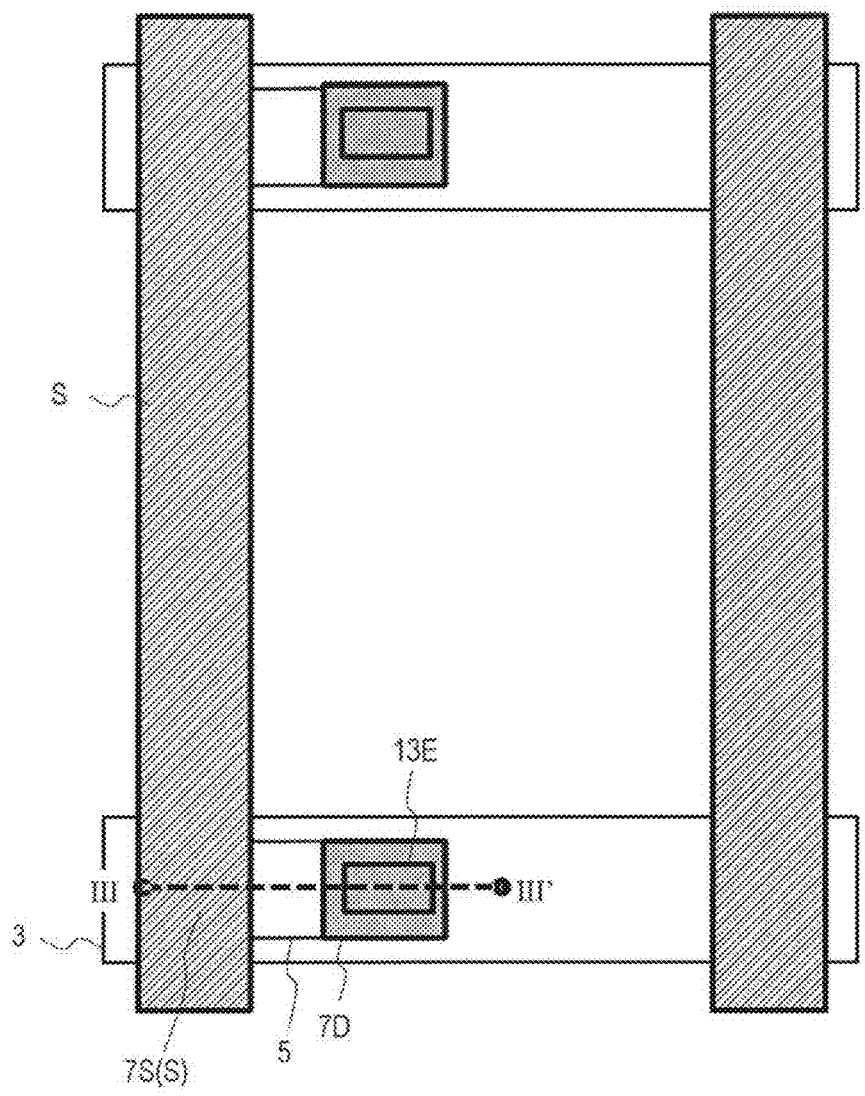

FIG.22
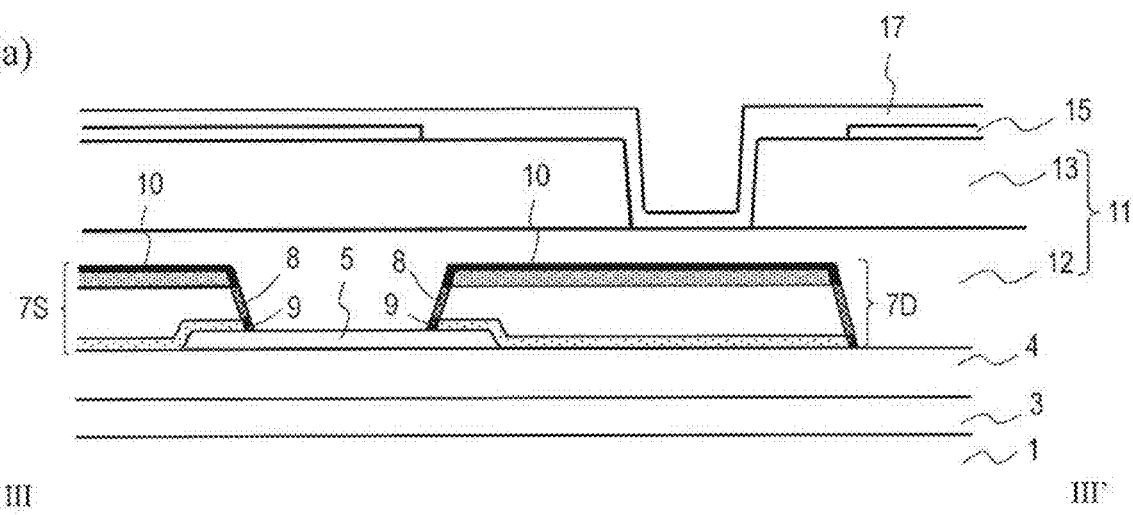
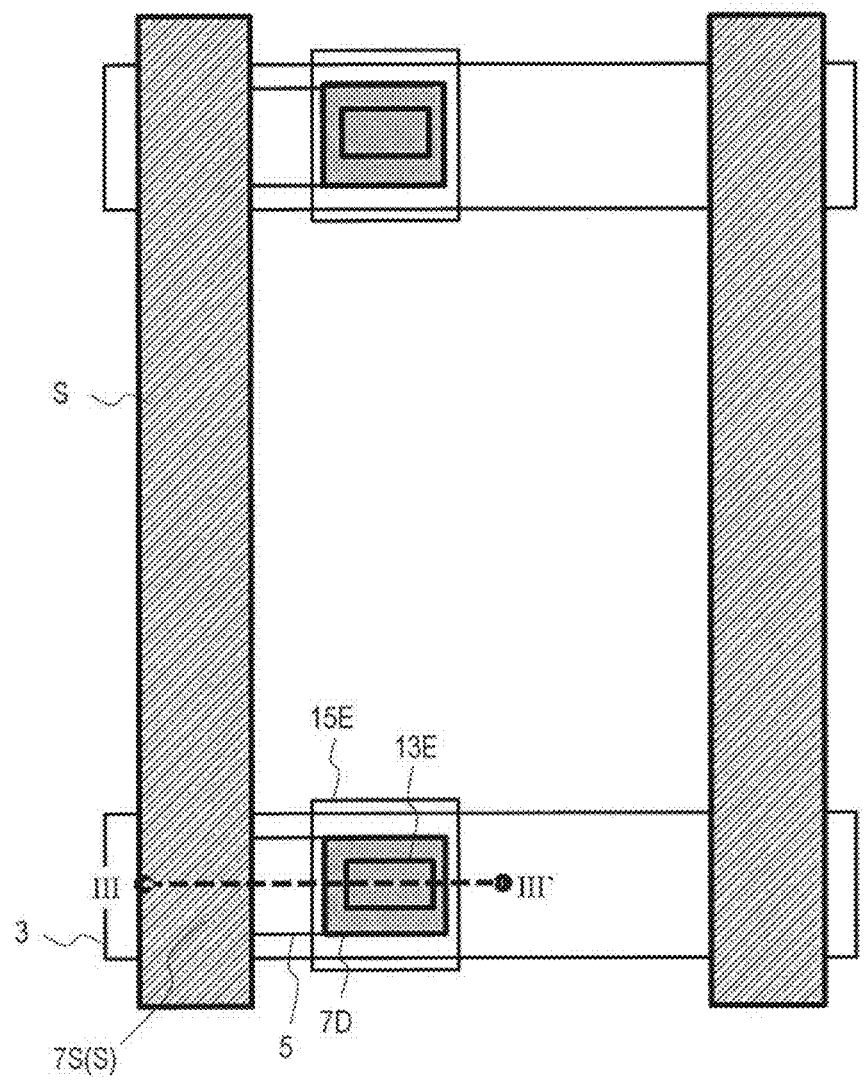

FIG.23
(a)
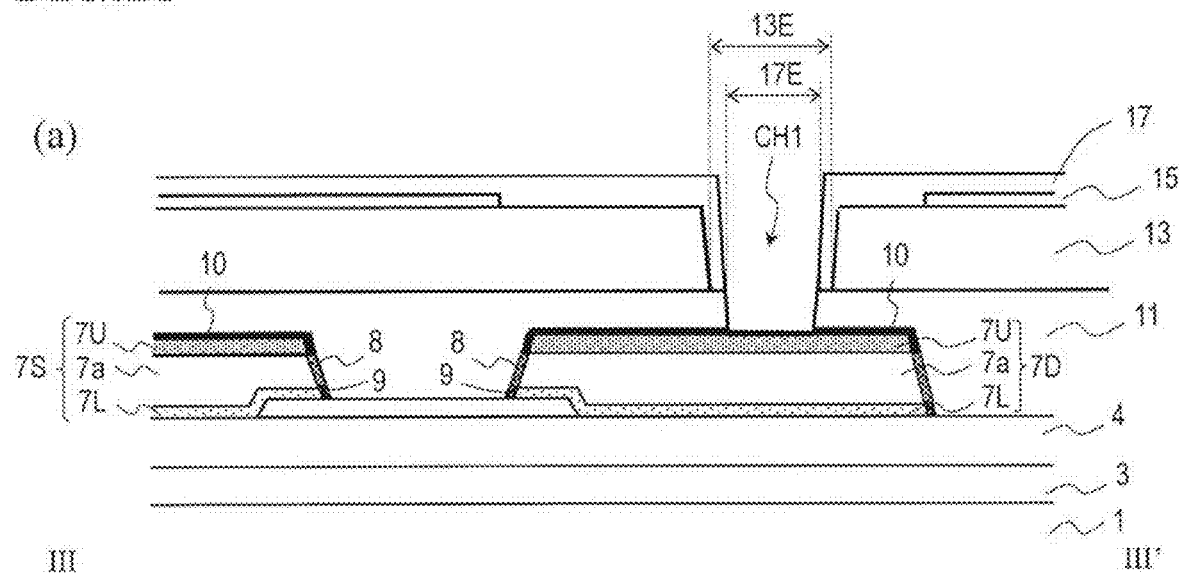
(b)
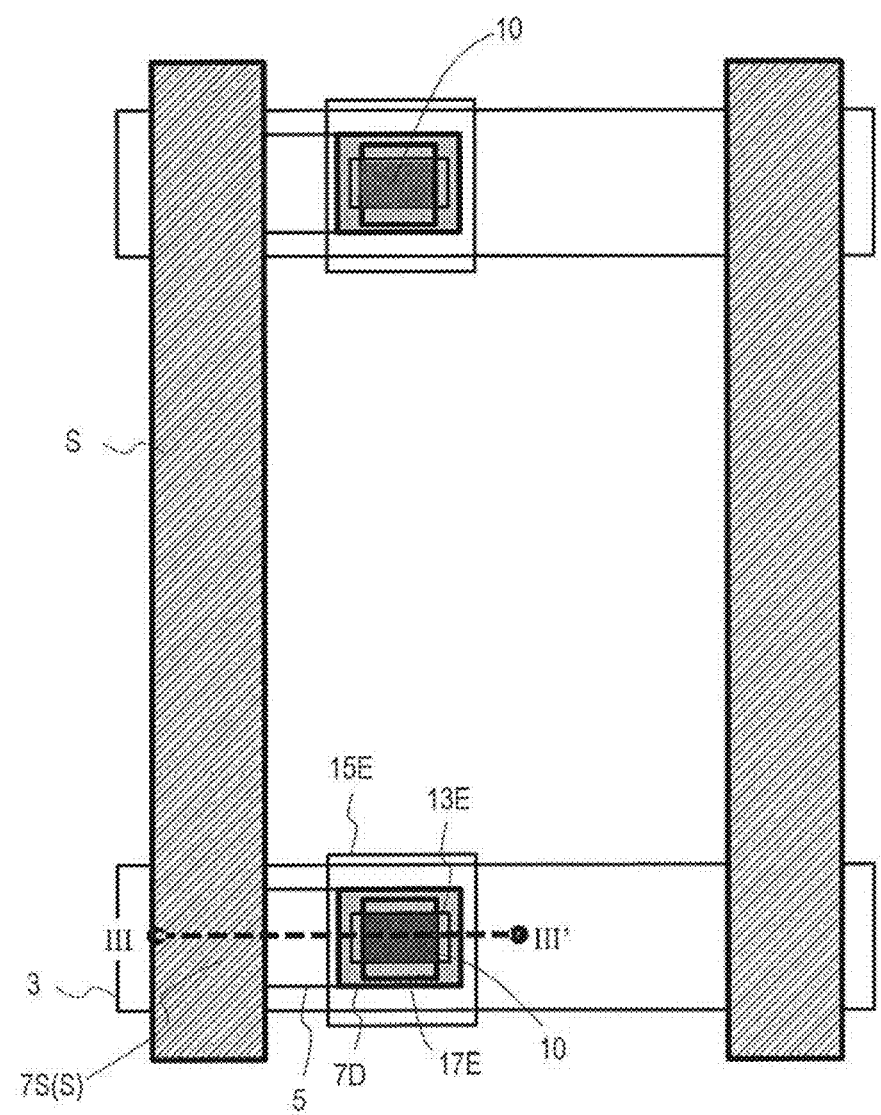

FIG.25
(a)
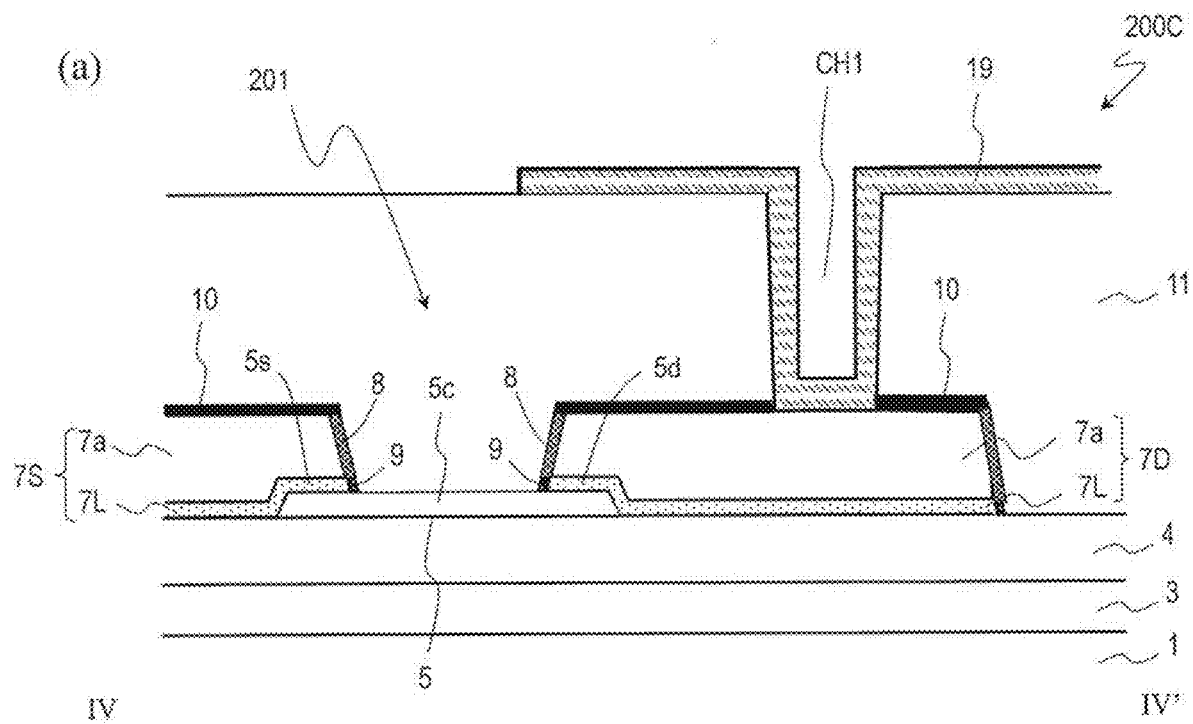
(b)
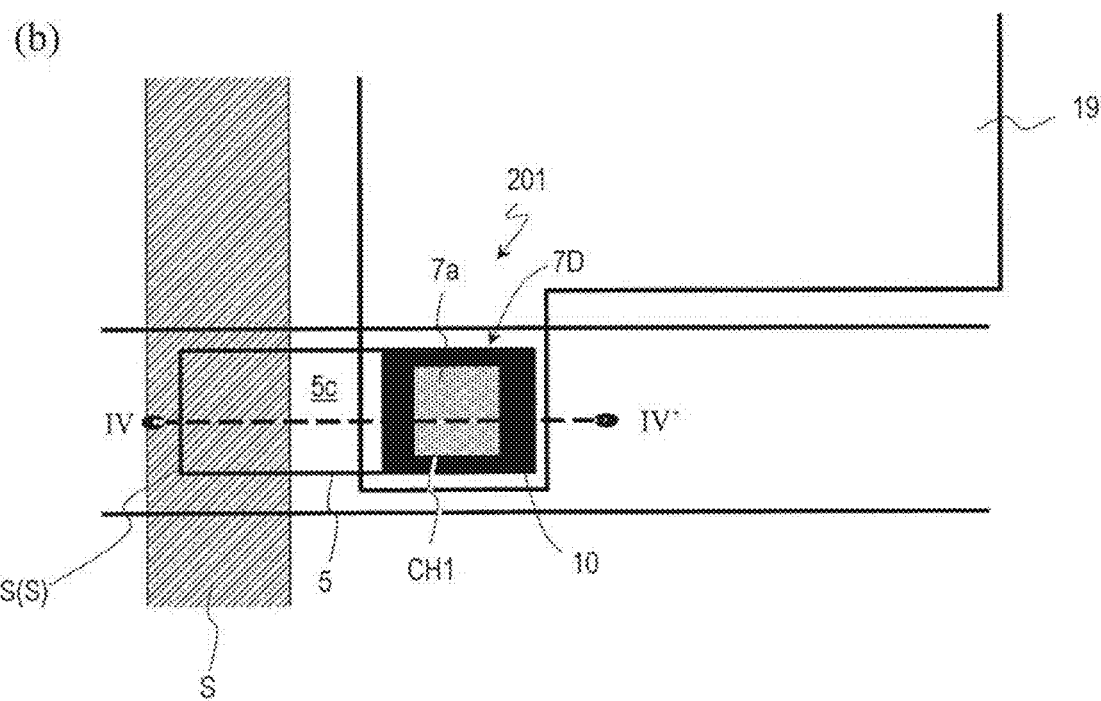

FIG.27
(a)
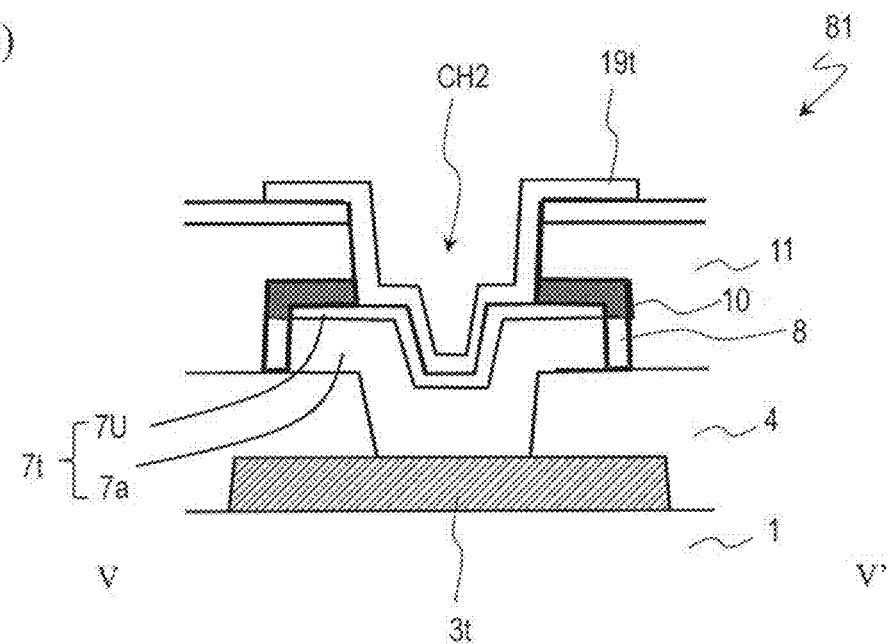
(b)
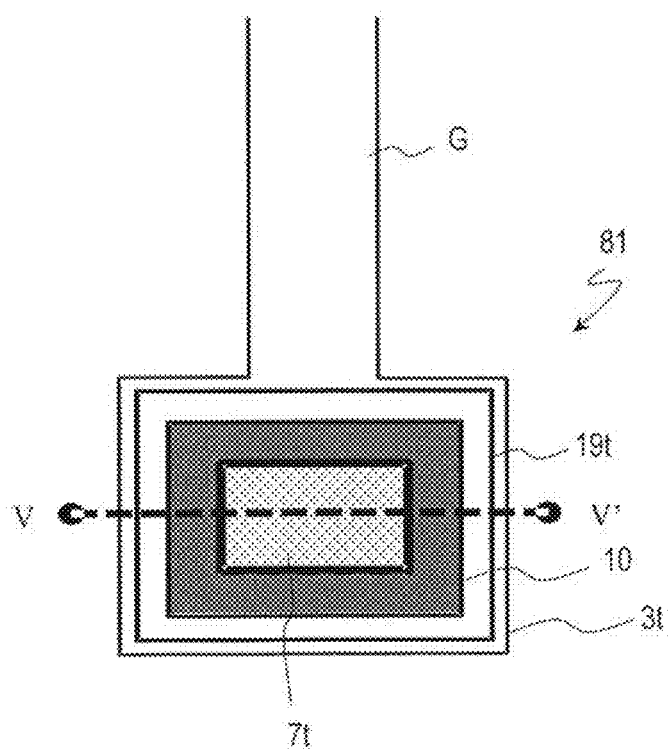

SEMICONDUCTOR DEVICE FORMED BY OXIDE SEMICONDUCTOR AND METHOD FOR MANUFACTURING SAME

TECHNICAL FIELD

The present invention relates to a semiconductor device formed by using an oxide semiconductor and a method for manufacturing the same.

BACKGROUND ART

An active matrix substrate used in a liquid crystal display device, or the like, includes a switching element such as a thin film transistor (hereinafter, a "TFT") in each pixel. It has been proposed to use a TFT whose active layer is an oxide semiconductor layer (hereinafter, referred to as an "oxide semiconductor TFT") as the switching element.

An oxide semiconductor TFT includes a protection layer (passivation layer) formed on an oxide semiconductor layer by a CVD method or a sputtering method using a plasma, for example, in order to suppress deterioration of TFT characteristics over time. When forming the protection layer, however, the surface of the oxide semiconductor layer may possibly be damaged. Specifically, oxygen deficiency may occur in the oxide semiconductor layer or hydrogen may diffuse from the protection layer, thereby lowering the resistance (conductorization) of the surface of the oxide semiconductor layer. When the resistance of the oxide semiconductor layer lowers, the threshold voltage greatly shifts toward the negative side (depletion characteristic), and desired TFT characteristics may be not realized.

In view of this, it has been proposed to perform an oxidation treatment such as an $N_2O$ plasma treatment on the oxide semiconductor layer immediately before the formation of the protection layer. For example, by irradiating the oxide semiconductor surface with an $N_2O$ plasma to oxidize the surface of the oxide semiconductor layer, it is possible to reduce the damage to be inflicted upon the oxide semiconductor layer during the formation of the protection layer.

However, if the surface of the source and drain electrodes of the oxide semiconductor TFT is exposed when the $N_2O$ plasma treatment is performed, the exposed electrode surface may possibly be exposed to the $N_2O$ plasma and oxidized. For example, Patent Document 1 states that when copper (Cu) or a Cu alloy is used as the electrode material, an oxide film may be formed on the electrode surface through the $N_2O$ plasma treatment.

CITATION LIST

Patent Literature

[Patent Document No. 1] Japanese Laid-Open Patent Publication No. 2012-243779

SUMMARY OF INVENTION

Technical Problem

As a result of a study, the present inventors found that with the structure proposed in Patent Document 1, the resistance (contact resistance) of the contact portion between the drain electrode and the pixel electrode (transparent conductive layer) may possibly increase due to the oxide film formed on the drain electrode surface during the $N_2O$ plasma treatment.

In view of such a problem, an embodiment of the present invention has an object to provide a semiconductor device including an oxide semiconductor TFT, with which it is possible to suppress an increase in the resistance of the contact portion between the drain electrode and the transparent conductive layer of the oxide semiconductor TFT while ensuring TFT characteristics.

Solution to Problem

A semiconductor device according to one embodiment of the present invention includes: a substrate; a thin film transistor supported on the substrate, the thin film transistor including a gate electrode, an oxide semiconductor layer, a gate insulating layer formed between the gate electrode and the oxide semiconductor layer, and a source electrode and a drain electrode in contact with an upper surface of the oxide semiconductor layer; an interlayer insulating layer arranged so as to cover the thin film transistor and to be in contact with a channel region of the thin film transistor; and a transparent conductive layer arranged on the interlayer insulating layer, wherein: the source electrode and the drain electrode each include a copper layer; a copper oxide film is further provided between the source and drain electrodes and the interlayer insulating layer; the interlayer insulating layer covers the drain electrode with the copper oxide film interposed therebetween; and in a first contact hole formed in the interlayer insulating layer, the transparent conductive layer is in direct contact with the copper layer of the drain electrode without the copper oxide film interposed therebetween.

In one embodiment, the copper oxide film is in contact with the copper layer in the source electrode and the drain electrode; and an interface between the copper layer and the transparent conductive layer is flatter than an interface between the copper layer and the interlayer insulating layer.

In one embodiment, in the first contact hole, an edge portion of the copper oxide film is located on an outer side with respect to an edge portion of the interlayer insulating layer as seen from the direction normal to a surface of the substrate.

In one embodiment, a thickness of the copper oxide film is 10 nm or more and 70 nm or less.

In one embodiment, the copper oxide film is an oxide film formed by exprosing a surface of the copper layer to an oxidation treatment.

In one embodiment, each of the source electrode and the drain electrode further includes a lower layer which is arranged on the substrate side of the copper layer and in contact with the oxide semiconductor layer, the lower layer including titanium or molybdenum.

In one embodiment, the semiconductor device further includes a terminal portion formed on the substrate, the terminal portion including: a source connection layer formed from the same conductive film as the source electrode and the drain electrode; the interlayer insulating layer provided extending over the source line; and an upper conductive layer formed from the same transparent conductive film as the transparent conductive layer, wherein: a portion of an upper surface of the source connection layer is covered by the copper oxide film; the interlayer insulating layer covers the source connection layer with the copper oxide film interposed therebetween; and in a second contact hole formed in the interlayer insulating layer, the upper conductive layer is in direct contact with the source connection layer without the copper oxide film interposed therebetween.

In one embodiment, the semiconductor device further includes an alignment mark portion having a mark layer formed from the same conductive film as the source electrode and the drain electrode, wherein: a portion of an upper surface of the mark layer is covered by the copper oxide film; the interlayer insulating layer is in contact with the portion of the upper surface of the mark layer with the copper oxide film interposed therebetween and has an opening over the mark layer; and the copper oxide film is not arranged on a portion of the upper surface of the mark layer that overlaps with the opening as seen from the direction normal to the substrate.

In one embodiment, the thin film transistor has a channel-etched structure.

In one embodiment, the oxide semiconductor layer includes an In—Ga—Zn—O-based semiconductor.

In one embodiment, the oxide semiconductor layer includes a crystalline portion.

A method for manufacturing a semiconductor device according to one embodiment of the present invention includes: a step (A) of forming a thin film transistor by forming, on a substrate, a gate electrode, a gate insulating layer, an oxide semiconductor layer, and a source electrode and a drain electrode including a copper layer; an oxidation treatment step (B) of performing an oxidation treatment on at least a channel region of the oxide semiconductor layer, thereby increasing an oxygen concentration of a surface of the at least one portion to be the channel region and oxidizing a surface of the source electrode and the drain electrode to form a copper oxide film; a step (C) of forming an interlayer insulating layer so as to cover the thin film transistor and to be in contact with the channel region; a contact hole formation step (D) of forming a first contact hole in a portion of the interlayer insulating layer that is located over the drain electrode, thereby exposing the copper oxide film; a step (E) of removing a portion of the copper oxide film that is exposed through the first contact hole using a chelate cleaning method, thereby exposing the copper layer, and a step (F) of forming a transparent conductive layer so that the transparent conductive layer is in direct contact with the copper layer exposed in the first contact hole.

The thin film transistor may have a channel-etched structure.

The oxide semiconductor layer may include an In—Ga—Zn—O-based semiconductor.

The oxide semiconductor layer may include a crystalline portion.

Another semiconductor device according to the present invention includes: a substrate; a thin film transistor supported on the substrate, the thin film transistor having a gate electrode, an oxide semiconductor layer, a gate insulating layer formed between the gate electrode and the oxide semiconductor layer, and a source electrode and a drain electrode electrically connected to the oxide semiconductor layer; an interlayer insulating layer arranged so as to cover the thin film transistor and to be in contact with a channel region of the thin film transistor, and a transparent conductive layer arranged on the interlayer insulating layer, wherein: the source electrode and the drain electrode each include copper, the semiconductor device further includes a metal oxide film including copper arranged between the source electrode and the drain electrode and the interlayer insulating layer; the interlayer insulating layer covers the drain electrode with the metal oxide film interposed therebetween; and in a contact hole formed in the interlayer insulating layer, the transparent conductive layer is in direct contact with the drain electrode without the metal oxide film interposed therebetween.

In one embodiment, the source electrode and the drain electrode are in contact with an upper surface of the oxide semiconductor layer.

In one embodiment, the source electrode and the drain electrode include a copper layer, and the metal oxide film is a copper oxide film.

In one embodiment, the metal oxide film is a copper alloy oxide film including copper and at least one metal element other than copper.

In one embodiment, the source electrode and the drain electrode further include a copper layer and a copper alloy layer formed on the copper layer; and the copper alloy layer contains a copper alloy including copper and the at least one metal element.

Advantageous Effects of Invention

According to an embodiment of the present invention, it is possible to suppress an increase in the resistance (contact resistance) of the contact portion between the drain electrode and the transparent conductive layer while ensuring the characteristics of the oxide semiconductor TFT.

BRIEF DESCRIPTION OF DRAWINGS

FIGS. 1 (a) and (b) are a schematic cross-sectional view and a plan view, respectively, showing a semiconductor device 100A according to a first embodiment.

FIG. 2 A schematic cross-sectional view showing another semiconductor device 100B according to the first embodiment.

FIGS. 3 (a) and (b) are a cross-sectional view and a plan view, respectively, of a process step illustrating an example method for manufacturing the semiconductor device 100B.

FIGS. 4 (a) and (b) are a cross-sectional view and a plan view, respectively, of a process step illustrating an example method for manufacturing the semiconductor device 100B.

FIGS. 8 (a) and (b) are a cross-sectional view and a plan view, respectively, of a process step illustrating an example method for manufacturing the semiconductor device 100B.

FIGS. 9 (a) and (b) are a cross-sectional view and a plan view, respectively, of a process step illustrating an example method for manufacturing the semiconductor device 100B.

FIGS. 10 (a) and (b) a cross-sectional view and a plan view, respectively, of a process step illustrating an example method for manufacturing the semiconductor device 100B, and (c) is an enlarged cross-sectional view illustrating the contact portion.

FIGS. 11 (a) and (b) are a cross-sectional view and a plan view, respectively, of a process step illustrating an example method for manufacturing the semiconductor device 100B.

FIGS. 15 (a) and (b) are a cross-sectional view and a plan view, respectively, illustrating a gate terminal portion 80 according to the first embodiment.

FIGS. 16 (a) and (b) are a schematic cross-sectional view and a schematic plan view, respectively, showing a semiconductor device 200A according to a second embodiment.

FIGS. 18 (a) and (b) are a cross-sectional view and a plan view, respectively, of a process step illustrating an example method for manufacturing the semiconductor device 200B.

FIGS. 19 (a) and (b) are a cross-sectional view and a plan view, respectively, of a process step illustrating an example method for manufacturing the semiconductor device 200B.

FIGS. 20 (a) and (b) are a cross-sectional view and a plan view, respectively, of a process step illustrating an example method for manufacturing the semiconductor device 200B.

FIGS. 21 (a) and (b) are a cross-sectional view and a plan view, respectively, of a process step illustrating an example method for manufacturing the semiconductor device 200B.

FIGS. 22 (a) and (b) are a cross-sectional view and a plan view, respectively, of a process step illustrating an example method for manufacturing the semiconductor device 200B.

FIGS. 23 (a) and (b) are a cross-sectional view and a plan view, respectively, of a process step illustrating an example method for manufacturing the semiconductor device 200B.

FIGS. 25 (a) and (b) are a schematic cross-sectional view and a schematic plan view, respectively, of a semiconductor device 200C according to the present embodiment.

FIGS. 27 (a) and (b) are a cross-sectional view and a plan view, respectively, illustrating a gate terminal portion 81 according to the second embodiment.

DESCRIPTION OF EMBODIMENTS

Problems with conventional electrode structures will now be described in detail with reference to the drawings.

Figure 29:
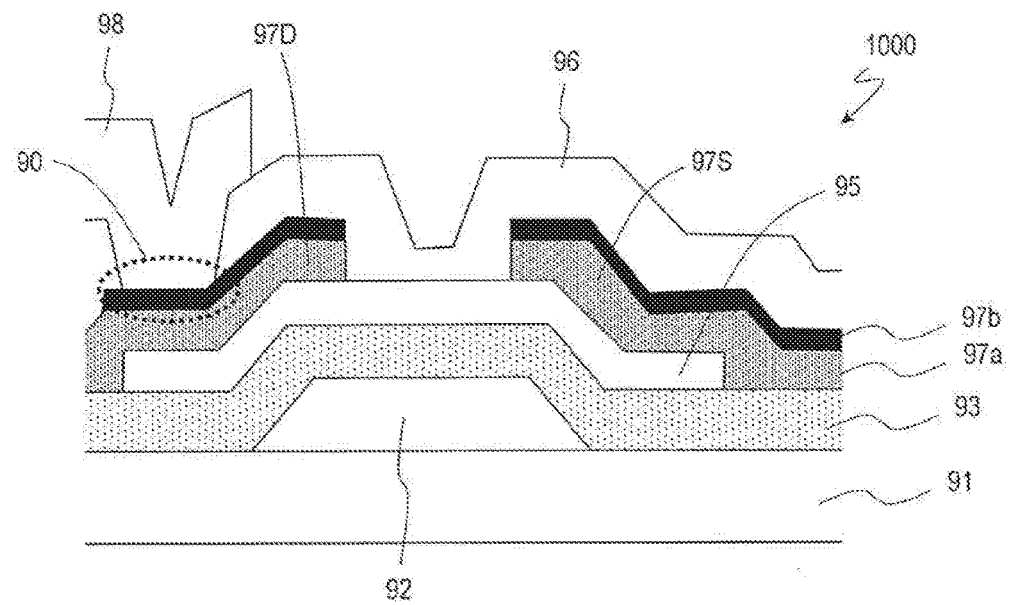
FIG. 29 A cross-sectional view showing a conventional oxide semiconductor TFT disclosed in Patent Document 1.

FIG. 29 is a cross-sectional view of an oxide semiconductor TFT disclosed in Patent Document 1. An oxide semiconductor TFT 1000 includes a gate electrode 92 formed on a substrate 91, a gate insulating layer 93 covering the gate electrode 92, an oxide semiconductor layer 95, a source electrode 97S and a drain electrode 97D (which may be referred to collectively as a source/drain electrode 97), and a protection layer 96. The source/drain electrode 97 has a layered structure including a first layer 97a made of Cu and a second layer 97b made of a Cu—Zn alloy, for example. The protection layer 96 is arranged on the source/drain electrode 97 so as to be in contact with the channel portion of the oxide semiconductor layer 95. The drain electrode 97D is in contact with a transparent conductive film 98 provided on the protection layer 96 in a contact hole formed in the protection layer 96.

With a channel-etched oxide semiconductor TFT, such as the oxide semiconductor TFT 1000, after the formation of the oxide semiconductor layer 95 and the source/drain electrode 97 and before the formation of the protection layer 96, an oxidation treatment such as an $N_2O$ plasma treatment is performed on the oxide semiconductor layer 95. Through this treatment, the oxygen concentration on the surface of the oxide semiconductor layer 95 increases, thereby forming an oxygen excessive region. Thus, when the protection layer 96 is formed by a plasma CVD method, for example, it is possible to suppress an oxygen defect from occurring in the oxide semiconductor layer 95 and suppress the lowering of the resistance on the surface of the oxide semiconductor layer 95 due to hydrogen included in the deposition gas.

As a result of a study, however, the present inventors found a problem as follows with the oxide semiconductor TFT 1000.

With the oxide semiconductor TFT 1000, the surface of the source/drain electrode 97 is exposed when an $N_2O$ plasma treatment is performed on the oxide semiconductor layer 95. Therefore, these electrode surfaces are also oxidized, thereby forming metal oxide films (not shown). Then, the protection layer 96 is formed so as to cover the oxide semiconductor TFT 1000, and a contact hole is provided in the protection layer 96. A metal oxide film is exposed on the bottom surface of the contact hole. Note that when a resist mask used for the formation of the contact hole is removed by a stripping solution, a portion of the exposed portion of the metal oxide film may also be removed depending on conditions such as the type of the stripping solution and the process time. However, it is difficult to remove the entirety of the exposed portion of the metal oxide film. As a result, at a contact portion 90 between the drain electrode 97D and the transparent conductive film 98, a metal oxide film may possibly be present interposed between the drain electrode 97D and the transparent conductive film 98, thereby increasing the contact resistance.

The metal oxide film formed by an oxidation treatment has thickness variations. Moreover, the electrode surface exposed to the oxidation treatment may have irregularities in conformity with the thickness variations of the metal oxide film. As a result of a study, the present inventors found that the contact resistance may vary across the substrate due to the thickness variations of the metal oxide film and the surface irregularities of the electrode.

Note that the "metal oxide film" as used herein does not include a natural oxide film produced on the surface of a metal. Since a natural oxide film is thin (thickness: less than 5 nm, for example), its influence on the contact resistance is sufficiently smaller than that of the metal oxide film described above, and it is believed that the problem as described above is unlikely to occur. The "metal oxide film" as used in the present specification refers to an oxide film (thickness: 5 nm or more, for example) formed by an oxidation treatment performed on a metal layer or by a deposition process such as a sputtering method. This is also true for the "copper oxide film (Cu oxide film)", the "copper alloy oxide film (Cu alloy oxide film)" or the "copper-containing metal oxide film".

The present inventors found that the problem described above can be solved, without complicating the process, by selectively removing a portion of the metal oxide film formed on the source and drain electrode surface that is located in the contact portion, thus arriving at the present invention.

First Embodiment

A first embodiment of a semiconductor device according to the present invention will be described with reference to the drawings. The semiconductor device of the present embodiment includes an oxide semiconductor TFT. Note that the semiconductor device of the present embodiment is only required to have an oxide semiconductor TFT, and it generally encompasses active matrix substrates, various display devices and electronic devices, etc.

FIGS. 1(a) and 1(b) are a schematic cross-sectional view and a schematic plan view, respectively, showing the semiconductor device 100A of the present embodiment. FIG. 1(a) shows a cross section taken along line I-I' of FIG. 1(b).

The semiconductor device 100A includes an oxide semiconductor TFT 101, an interlayer insulating layer 11 covering the oxide semiconductor TFT 101, and the transparent conductive layer 19 electrically connected to the oxide semiconductor TFT 101. When the oxide semiconductor TFT 101 is used as a switching element of an active matrix substrate, the transparent conductive layer 19 may be a pixel electrode.

The oxide semiconductor TFT 101 is a channel-etched TFT, for example. The oxide semiconductor TFT 101 includes a gate electrode 3 supported on a substrate 1, a gate insulating layer 4 covering the gate electrode 3, an oxide semiconductor layer 5 arranged so as to be laid over the gate electrode 3 with the gate insulating layer 4 interposed therebetween, and a source electrode 7S and a drain electrode 7D. The source electrode 7S and the drain electrode 7D are each arranged so as to be in contact with the upper surface of the oxide semiconductor layer 5.

The source electrode 7S and the drain electrode 7D (which may hereinafter be referred to collectively as a "source/drain electrode 7") include a Cu layer (hereinafter referred to as a "main layer") 7a. The main layer 7a is only required to be a layer whose main component is Cu, and may include impurities. The source/drain electrode 7 may have a layered structure including the main layer 7a. The Cu content of the main layer 7a of the source/drain electrode 7 may be 90% or more, for example. Preferably, the main layer 7a is a pure Cu layer (Cu content: 99.99% or more, for example).

In the present embodiment, the upper surface of the source/drain electrode 7 is the main layer (Cu layer) 7a. Between the source/drain electrode 7 and the interlayer insulating layer 11, a Cu oxide film 8 is formed so as to be in contact with the upper surface of the source/drain electrode 7 (herein, the upper surface of the main layer 7a).

The oxide semiconductor layer 5 includes a channel region 5c, and a source contact region 5s and a drain contact region 5d located on the opposite sides of the channel region 5c. The source electrode 7S is formed so as to be in contact with the source contact region 5s, and the drain electrode 7D is formed so as to be in contact with the drain contact region 5d.

The interlayer insulating layer 11 is arranged so as to be in contact with the channel region 5c of the oxide semiconductor layer 5. The interlayer insulating layer 11 is arranged so as to cover the source electrode 7S and the drain electrode 7D with the Cu oxide film 8 interposed therebetween. In this example, the interlayer insulating layer 11 is in contact with the Cu oxide film 8. A contact hole CH1 that reaches the surface of the drain electrode 7D (herein, the surface of the main layer 7a) is formed in the interlayer insulating layer 11. As seen from the direction normal to the substrate 1, the Cu oxide film 8 is not arranged on the bottom surface of the contact hole CH1, and the surface of the drain electrode 7D is exposed.

The transparent conductive layer 19 is provided on the interlayer insulating layer 11 and in the contact hole CH1. In the contact hole CH1, the transparent conductive layer 19 is in direct contact with the drain electrode 7D (herein, the main layer 7a) without the Cu oxide film 8 interposed therebetween.

The Cu oxide film 8 in the present embodiment may be an oxide film that is formed as the surface of the source/drain electrode 7 (herein, the surface of the CU layer, which is the main layer 7a) is exposed to an oxidation treatment when the oxidation treatment is performed on the channel region of the oxide semiconductor layer 5.

There is no particular limitation on the thickness (average thickness) of the Cu oxide film 8, which varies depending on the composition of the surface of the source/drain electrode 7, the oxidation treatment method and conditions thereof, etc., but it may be 10 nm or more and 100 nm (e.g., 10 nm or more and 70 nm or less). As an example, when the Cu layer is oxidized by an $N_2O$ plasma treatment (e.g., $N_2O$ gas flow rate: 3000 sccm, pressure: 100 Pa, plasma power density: 1.0 W/cm$^2$, process time: 200 to 300 sec, substrate temperature: 200° C.), the Cu oxide film 8 having a thickness of 20 nm or more and 60 nm or less, for example, is formed.

In the contact hole CH1, the Cu oxide film 8 is removed from the surface of the drain electrode 7D. By performing chelate cleaning, for example, a portion of the Cu oxide film 8 that is located on the bottom surface of the contact hole CH1 can be selectively removed, the details of which will be described later.

Note that there is no particular limitation on the method for forming the Cu oxide film 8. The Cu oxide film 8 may be a film formed on the main layer 7a by a deposition process such as a sputtering method. Even in such a case, chelate cleaning can be performed after the formation of the contact hole CH1, thereby selectively removing a portion of the Cu oxide film 8 that is located on the bottom surface of the contact hole CH1.

The oxide semiconductor TFT 101 of the present embodiment may have a channel-etched structure. If the oxide semiconductor TFT 101 is of a channel-etched type, the Cu oxide film 8 is formed on the surface of the source/drain electrode 7, simultaneously with the oxidation treatment performed on the channel region of the oxide semiconductor layer 5. Note that with a "channel-etched TFT", as can be seen from FIG. 1, no etch stop layer is formed on the channel region, and the channel-side end portions of the source electrode 7S and the drain electrode 7D are arranged so as to be in contact with the upper surface of the oxide semiconductor layer 5. A channel-etched TFT is formed by, for example, forming a conductive film to be a source/drain electrode on the oxide semiconductor layer 5, and performing source-drain separation. In the source-drain separation step, a surface portion of the channel region may be etched.

The semiconductor device 100A is applicable to active matrix substrates of display devices, for example. The semiconductor device 100A is applicable to display devices of vertical electric field drive schemes such as the VA mode, for example. An active matrix substrate includes a display region (active region) that contributes to display, and a peripheral region (bezel region) located outside the display region.

As shown in FIG. 1(b), a plurality of gate lines G and a plurality of source lines S are formed in the display region, and each region delimited by these lines is a "pixel". A plurality of pixels are arranged in a matrix pattern. A transparent conductive layer (pixel electrode) 19 is formed in each pixel. The pixel electrode 19 is separated for each pixel. In each pixel, the oxide semiconductor TFT 101 is formed in the vicinity of the intersection between a source line S and a gate line G. The drain electrode 7D of the oxide semiconductor TFT 101 is electrically connected to the corresponding pixel electrode 19.

The source line S may be formed integral with the source electrode 7S of the oxide semiconductor TFT 101. That is, the source line S includes the main layer 7a whose main component is Cu, and the Cu oxide film 8 may be formed also on the upper surface and the side surface of the source line S, as with the source/drain electrode 7.

The semiconductor device of the present embodiment may further include another electrode layer that functions as a common electrode on the pixel electrode 19 or between the interlayer insulating layer 11 and the pixel electrode 19. Thus, a semiconductor device having two transparent electrode layers is obtained. Such a semiconductor device is applicable to display devices of the FFS mode, for example.

FIG. 2 is a schematic cross-sectional view of another semiconductor device (active matrix substrate) 100B of the present embodiment. In FIG. 2, like elements to those of FIG. 1 are denoted by like reference signs and will not be discussed below.

The semiconductor device 100B includes a common electrode 15 provided between the interlayer insulating layer 11 and the transparent conductive layer (pixel electrode) 19 so as to oppose the transparent conductive layer 19. A third insulating layer 17 is formed between the common electrode 15 and the pixel electrode 19.

Figure 5:
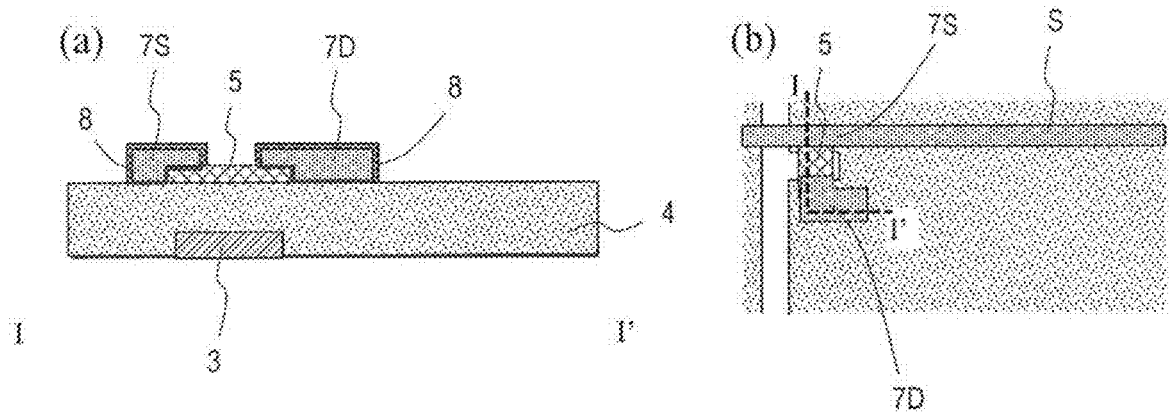
FIGS. 5 (a) and (b) are a cross-sectional view and a plan view, respectively, of a process step illustrating an example method for manufacturing the semiconductor device 100B.
Figure 6:
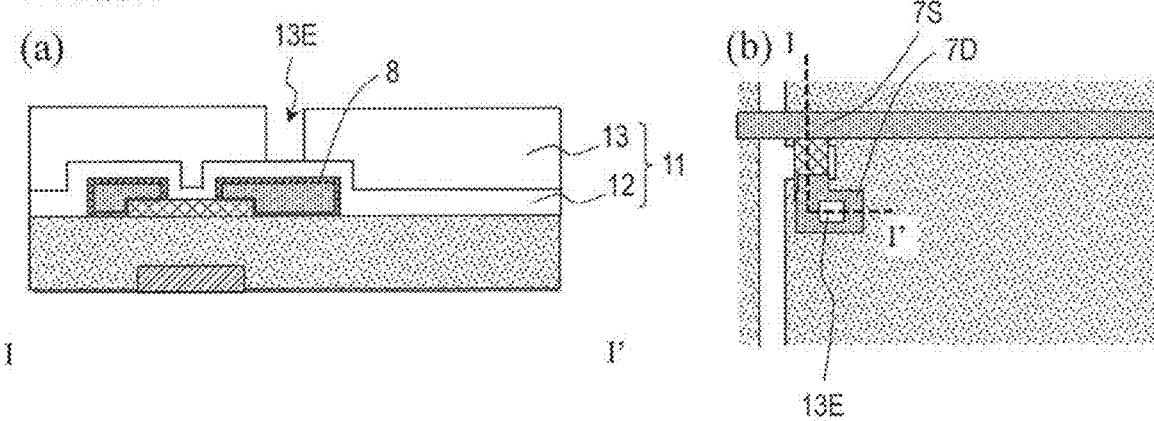
FIGS. 6 (a) and (b) are a cross-sectional view and a plan view, respectively, of a process step illustrating an example method for manufacturing the semiconductor device 100B.
Figure 7:
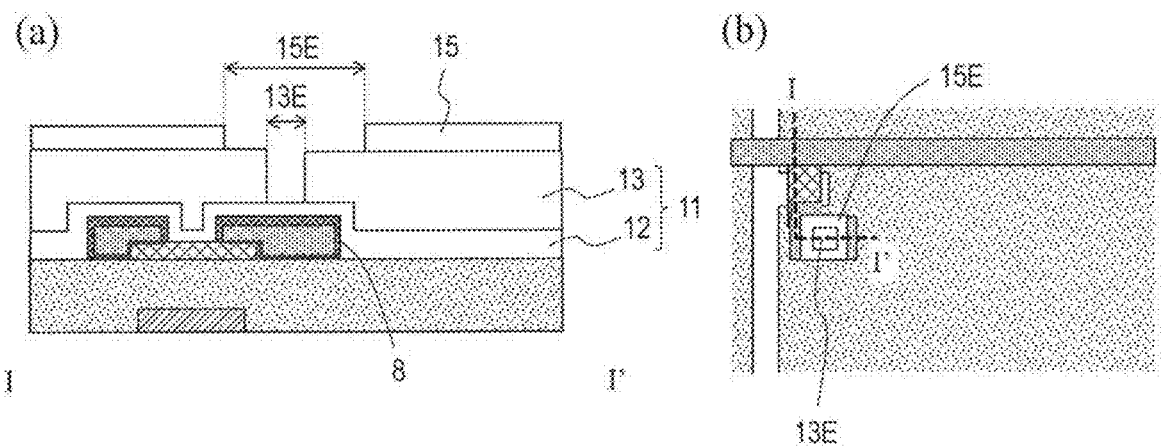
FIGS. 7 (a) and (b) are a cross-sectional view and a plan view, respectively, of a process step illustrating an example method for manufacturing the semiconductor device 100B.

A common signal (COM signal) is applied to the common electrode 15. The common electrode 15 has an opening 15E for each pixel, and a contact portion between the pixel electrode 19 and the drain electrode 7D of an oxide semiconductor TFT 102 may be formed in the opening 15E (see FIG. 7). In this example, the pixel electrode 19 and the drain electrode 7D (the main layer 7a) are in direct contact with each other in the contact hole CH1. The common electrode 15 may be formed generally across the entirety of the display region (excluding the openings 15E described above).

With the semiconductor device 100B, the source/drain electrode 7 of the oxide semiconductor TFT 102 has a layered structure including a Cu layer, which is the main layer 7a, and a lower layer (e.g., a Ti layer) 7L located on the substrate 1 side of the main layer 7a. The lower layer 7L may include a metal element such as titanium (Ti) or Mo (molybdenum). Examples of the lower layer 7L include a Ti layer, an Mo layer, a titanium nitride layer and a molybdenum nitride layer. Alternatively, it may be a Ti- or Mo-containing alloy layer. In this example, the lower layer 7L of the source/drain electrode 7 is in contact with the upper surface of the oxide semiconductor layer 5. By the provision of the lower layer 7L, it is possible to reduce the contact resistance between the oxide semiconductor layer 5 and the source/drain electrode 7.

In the present embodiment, the source/drain electrode 7 and the source line S are formed by using the same metal film. The Cu oxide film 8 is arranged on the upper surface and the side surface of these electrodes and lines (source wiring layer). An oxide film (herein, a Ti oxide film) 9 of a metal included in the lower layer is arranged on the side surface of the lower layer 7L. The Cu oxide film 8 and the metal oxide film 9 are oxide films that are formed by the oxidation of the exposed surface of the source wiring layer (including the source/drain electrode 7) during the oxidation treatment performed on the oxide semiconductor layer 5, for example.

The interlayer insulating layer 11 may include a first insulating layer 12 in contact with the oxide semiconductor layer 5, and a second insulating layer 13 formed on the first insulating layer 12. The first insulating layer 12 may be an inorganic insulating layer, and the second insulating layer 13 may be an organic insulating layer.

The configuration of a semiconductor device having two transparent electrode layers is not limited to that shown in FIG. 2. For example, the pixel electrode 19 and the drain electrode 7D may be connected together via a transparent connection layer formed from the same transparent conductive film as the common electrode 15. In such a case, in the contact hole CH1, the transparent connection layer is arranged so as to be in direct contact with the main layer 7a of the drain electrode 7D. Although FIG. 2 shows an example in which the common electrode 15 is formed between the interlayer insulating layer 11 and the pixel electrode 19, the common electrode 15 may be formed on the pixel electrode 19 with the third insulating layer 17 interposed therebetween.

The semiconductor device 100B is applicable to display devices of the FFS mode, for example. In such a case, each pixel electrode 19 preferably includes a plurality of slit-shaped openings or slit portions. On the other hand, when the common electrode 15 is arranged at least under the slit-shaped openings or slit portions of the pixel electrode 19, the common electrode 15 can function as a counter electrode for the pixel electrode, thereby applying a transverse electric field through the liquid crystal molecules.

As seen from the direction normal to the substrate 1, at least a portion of the pixel electrode 19 may be laid over the common electrode 15 with the third insulating layer 17 interposed therebetween. Thus, a capacitor using the third insulating layer 17 as a dielectric layer is formed in an area where the pixel electrode 19 and the common electrode 15 are laid over each other. This capacitor can function as a storage capacitor (transparent storage capacitor) of the display device. A storage capacitor having a desired capacitance is obtained by appropriately adjusting the material and the thickness of the third insulating layer 17, the area of the portion forming the capacitor, etc. Therefore, there is no need to separately form a storage capacitor by using the same metal film as that of the source line, for example, in the pixel. Therefore, it is possible to suppress the lowering of the aperture ratio due to the formation of a storage capacitor using a metal film. The common electrode 15 may account for generally the entirety of the pixel (excluding the opening 15E). Thus, it is possible to increase the area of the storage capacitor.

Note that instead of the common electrode 15, a transparent conductive layer that opposes the pixel electrode 19 and functions as a storage capacitor electrode may be provided, forming a transparent storage capacitor in the pixel. Such a semiconductor device is applicable also to display devices of operation modes other than the FFS mode.

The following advantageous effects will be realized by the present embodiment.

With the semiconductor devices 100A and 100B, a portion of the upper surface of the drain electrode 7D is covered by the Cu oxide film 8. The interlayer insulating layer 11 covers the drain electrode 7D with the Cu oxide film 8 interposed therebetween. On the other hand, in the contact hole CH1, the transparent conductive layer 19 is in direct contact with the drain electrode 7D (herein, the main layer 7a) without the Cu oxide film 8 interposed therebetween. With such a configuration, it is possible to suppress the contact resistance between the transparent conductive layer 19 and the drain electrode 7D. Therefore, it is possible to suppress an increase in the contact resistance due to the Cu oxide film 8 produced on the electrode surface through the oxidation treatment described above, while ensuring the TFT characteristics by the oxidation treatment performed on the oxide semiconductor layer 5, for example.

A portion of the Cu oxide film 8 that is located on the bottom surface of the contact hole CH1 is preferably removed by chelate cleaning. The Cu oxide film 8 is formed on the surface of the main layer (Cu layer) 7a through an oxidation treatment such as an $N_2O$ plasma treatment, for example. The thickness of the Cu oxide film 8 formed by the oxidation treatment is likely to vary. Irregularities may be produced on the surface of the main layer (Cu layer) 7a. Even in such a case, chelate cleaning removes not only the Cu oxide film 8 but also the surface portion of the main layer 7a in the contact hole CH1, thereby advantageously flattening the surface of the main layer 7a. As a result, the interface between the main layer 7a and the transparent conductive layer 19 in the contact portion is flatter than the interface between the main layer 7a and the interlayer insulating layer 11 (i.e., the interface between the main layer 7a and the interlayer insulating layer 11 with the Cu oxide film 8 interposed therebetween). Thus, it is possible to more significantly reduce the contact resistance between the drain electrode 7D and the transparent conductive layer 19. Since it is possible to reduce the variations of the contact resistance across the substrate 1, it is possible to increase the reliability. Moreover, it is possible to more effectively increase the adhesion of the transparent conductive layer 19 to the drain electrode 7D.

Note that when a portion of the surface of the drain electrode 7D that is located on the bottom surface of the contact hole CH1 is flattened through chelate cleaning, it may be located below other portions that are covered by the Cu oxide film 8. When the Cu oxide film 8 is removed by chelate cleaning, the etching of the Cu oxide film 8 may also proceed in the lateral direction (side etch). In such a case, as seen from the direction normal to the substrate 1, the edge portion of the Cu oxide film 8 is located on the outer side with respect to the outline of the contact hole CH1 (the edge portion of the interlayer insulating layer 11).

<Manufacturing Method>

An example method for manufacturing a semiconductor device of the present embodiment will now be described, using a method for manufacturing the semiconductor device 100B as an example, with reference to the drawings.

FIG. 3 to FIG. 11 are diagrams illustrating an example method for manufacturing the semiconductor device 100B, wherein (a) shows a cross-sectional view taken along line I-I' of (b), and (b) shows a plan view.

First, as shown in FIGS. 3(a) and 3(b), the gate electrode 3, the gate line G, the gate insulating layer 4 and the oxide semiconductor layer 5 are formed in this order on the substrate 1.

The substrate 1 may be, for example, a glass substrate, a silicon substrate or a heat-resisting plastic substrate (resin substrate).

The gate electrode 3 may be formed integral with the gate line G. Herein, a gate line metal film (thickness: 50 nm or more and 500 nm or less, for example) is formed on the substrate (e.g., a glass substrate) 1 by a sputtering method, or the like. Then, the gate line metal film is patterned to obtain the gate electrode 3 and the gate line G. For example, a layered film (Cu/Ti film) whose upper surface is Cu and whose lower surface is Ti is used as the gate line metal film. Note that there is no particular limitation on the material of the gate line metal film. It may suitably be film containing a metal such as aluminum (Al), tungsten (W), molybdenum (Mo), tantalum (Ta), chromium (Cr), titanium (Ti) and copper (Cu), or an alloy thereof, or a metal nitride thereof.

The gate insulating layer 4 may be formed by a CVD method, or the like. The gate insulating layer 4 may suitably be a silicon oxide ($SiO_2$) layer, a silicon nitride (SiNx) layer, a silicon oxide nitride (SiOxNy; x>y) layer, a silicon nitride oxide (SiNxOy; x>y) layer, or the like. The gate insulating layer 4 may have a layered structure. For example, a silicon nitride layer, a silicon nitride oxide layer, or the like, may be formed on the substrate side (lower layer) in order to prevent the diffusion of impurities, etc., from the substrate 1, while forming a silicon oxide layer, a silicon oxide nitride layer, or the like, as a layer thereon (upper layer) in order to ensure insulation. Note that if an oxygen-containing layer (e.g., an oxide layer such as $SiO_2$) is used as the uppermost layer of the gate insulating layer 4 (i.e., the layer in contact with the oxide semiconductor layer), when oxygen deficiency occurs in the oxide semiconductor layer, the oxygen deficiency can be recovered with oxygen contained in the oxide layer, and it is possible to effectively reduce the oxygen deficiency of the oxide semiconductor layer.

For the oxide semiconductor layer 5, an oxide semiconductor film (thickness: 30 nm or more and 200 nm or less, for example) is formed on the gate insulating layer 4 by using a sputtering method, for example. Then, the oxide semiconductor film is patterned by photolithography, thereby obtaining the oxide semiconductor layer 5. As seen from the direction normal to the substrate 1, at least a portion of the oxide semiconductor layer 5 is arranged so as to be laid over the gate electrode 3 with the gate insulating layer 4 interposed therebetween. Herein, the oxide semiconductor layer 5 is formed by patterning an In—Ga—Zn—O-based amorphous oxide semiconductor film (thickness: 50 nm, for example) including In, Ga and Zn at a ratio of 1:1:1, for example.

The oxide semiconductor layer 5 used in the present embodiment will now be described. The oxide semiconductor included in the oxide semiconductor layer 5 may be an amorphous oxide semiconductor or a crystalline oxide semiconductor having crystalline portions. The crystalline oxide semiconductor may be a polycrystalline oxide semiconductor, a microcrystalline oxide semiconductor, etc. The crystalline oxide semiconductor may be a crystalline oxide semiconductor whose c axis is oriented generally perpendicular to the layer plane.

The oxide semiconductor layer 5 may have a layered structure of two layers or more. When the oxide semiconductor layer 5 has a layered structure, the oxide semiconductor layer 5 may include an amorphous oxide semiconductor layer and a crystalline oxide semiconductor layer. Alternatively, it may include a plurality of crystalline oxide semiconductor layers of different crystalline structures. When the oxide semiconductor layer 5 has a two-layer structure including an upper layer and a lower layer, the energy gap of the oxide semiconductor included in the upper layer is preferably greater than the energy gap of the oxide semiconductor included in the lower layer. Note however that when the difference in energy gap between these layers is relatively small, the energy gap of the oxide semiconductor of the lower layer may be greater than the energy gap of the oxide semiconductor of the upper layer.

The materials, structures, deposition methods of the amorphous oxide semiconductor and the crystalline oxide semiconductors described above, and the configuration of the oxide semiconductor layer having a layered structure, etc., are described in Japanese Laid-Open Patent Publication No. 2014-007399. The entire disclosure of Japanese Laid-Open Patent Publication No. 2014-007399 is incorporated herein by reference.

The oxide semiconductor layer 5 may include at least one metal element selected from In, Ga and Zn, for example. In the present embodiment, the oxide semiconductor layer 5 includes an In—Ga—Zn—O-based semiconductor, for example. Herein, the In—Ga—Zn—O-based semiconductor is a ternary oxide of In (indium), Ga (gallium) and Zn (zinc), wherein there is no particular limitation on the ratio (composition ratio) between In, Ga and Zn, and it may be In:Ga:Zn=2:2:1, In:Ga:Zn=1:1:1, In:Ga:Zn=1:1:2, etc., for example. Such an oxide semiconductor layer 5 can be formed from an oxide semiconductor film including an In—Ga—Zn—O-based semiconductor. Note that a channel-etched TFT having an active layer including an In—Ga—Zn—O-based semiconductor may be referred to as a "CE-InGaZnO-TFT".

The In—Ga—Zn—O-based semiconductor may be amorphous or crystalline. The crystalline In—Ga—Zn—O-based semiconductor is preferably a crystalline In—Ga—Zn—O-based semiconductor whose c axis is oriented generally perpendicular to the layer plane.

Note that the crystalline structure of a crystalline In—Ga—Zn—O-based semiconductor is disclosed in Japanese Laid-Open Patent Publication No. 2014-007399, mentioned above, Japanese Laid-Open Patent Publication No. 2012-134475, Japanese Laid-Open Patent Publication No. 2014-209727, etc., for example. The entire disclosure of Japanese Laid-Open Patent Publication No. 2012-134475 and Japanese Laid-Open Patent Publication No. 2014-209727 is incorporated herein by reference. A TFT having an In—Ga—Zn—O-based semiconductor layer has a high mobility (20 times or more that of a-Si TFT) and a low leak current (1/100 or less of that of a-Si TFT), and it can suitably be used as a driving TFT and a pixel TFT.

The oxide semiconductor layer 5 may include another oxide semiconductor, instead of an In—Ga—Zn—O-based semiconductor. For example, it may include an In—Sn—Zn—O-based semiconductor (e.g., $In_2O_3$—$SnO_2$—ZnO). The In—Sn—Zn—O-based semiconductor is a ternary oxide of In (indium), Sn (tin) and Zn (zinc). Alternatively, the oxide semiconductor layer 5 may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, etc.

Next, as shown in FIGS. 4(a) and 4(b), the source/drain electrode 7 including a Cu layer as the main layer 7a is formed so as to be in contact with the upper surface of the oxide semiconductor layer 5. The source/drain electrode 7 is only required to have the main layer 7a including Cu as the main component, and it may have a single-layer structure or have a layered structure including a Cu layer and another conductive layer.

Specifically, first, although not shown in the figures, a source line metal film (thickness: 50 nm or more and 500 nm or less, for example) is formed on the gate insulating layer 4 and the oxide semiconductor layer 5. Herein, as the source line metal film, a layered film is formed, which includes a Ti film and a Cu film stacked together in this order starting from the oxide semiconductor layer 5 side. Note that a Cu film may be formed as the source line metal film. A source line metal film may be formed by a sputtering method, for example. The Cu film is only required to be a film including Cu as the main component, and it may include impurities. Preferably, it is a pure Cu film.

The thickness of the Cu film to be the main layer 7a may be 100 nm or more and 400 nm or less, for example. If it is 100 nm or more, it is possible to form electrodes and lines with a lower resistance. If it is over 400 nm, the coverage of the interlayer insulating layer 11 may lower. Note that the thickness of the main layer 7a upon completion of the finished product is smaller than the thickness of the Cu film upon deposition thereof by the amount that is consumed for the formation of the Cu oxide film 8 in the oxidation treatment step. Therefore, the thickness upon deposition is preferably set taking into consideration the amount to be consumed for the formation of the Cu oxide film 8.

Then, the source line metal film is patterned to obtain the source electrode 7S, the drain electrode 7D and the source line S. The source electrode 7S is arranged so as to be in contact with the source contact region 5s of the oxide semiconductor layer 5, and the drain electrode 7D is arranged so as to be in contact with the drain contact region 5d of the oxide semiconductor layer 5. A portion of the oxide semiconductor layer 5 that is located between the source electrode 7S and the drain electrode 7D is to be the channel region 5c. Thus, the oxide semiconductor TFT 101 is obtained.

The source electrode 7S, the drain electrode 7D and the source line S have a layered structure including the lower layer (herein, a Ti layer) 7L and the main layer (herein, a Cu layer) 7a arranged on the lower layer 7L. The main layer 7a forms the upper surface of the source electrode 7S and the drain electrode 7D. The lower layer 7L is in contact with the oxide semiconductor layer 5.

In this example, the source/drain electrode 7 includes the lower layer 7L including a metal element such as titanium (Ti) or Mo (molybdenum) on the substrate 1 side of the main layer 7a, for example. The lower layer 7L may be a Ti layer, an Mo layer, a titanium nitride layer, a molybdenum nitride layer, etc. Alternatively, it may be a Ti- or Mo-containing alloy layer.

The thickness of the lower layer 7L is preferably smaller than the main layer 7a. Then, the ON resistance can be made small. The thickness of the lower layer 7L may be 20 nm or more and 200 nm or less, for example. When it is 20 nm or more, it is possible to realize an effect of reducing the contact resistance while suppressing the total thickness of the source line metal film. When it is 200 nm or less, it is possible to more effectively reduce the contact resistance between the oxide semiconductor layer 5 and the source/drain electrode 7.

Then, an oxidation treatment is performed on the channel region 5c of the oxide semiconductor layer 5. Herein, a plasma treatment using an $N_2O$ gas is performed. Then, as shown in FIGS. 5(a) and 5(b), the oxygen concentration on the surface of the channel region is increased while the surface (exposed surface) of the source/drain electrode 7 is also oxidized, forming the Cu oxide film 8. The Cu oxide film 8 includes CuO. In this example, the exposed upper surface and side surface of the source/drain electrode 7 and the source line S are oxidized. As a result, the Cu oxide film 8 is formed on the upper surface and the side surface of the main layer 7a. Although not shown in the figure, a metal oxide film (Ti oxide film) may be formed on the side surface of the lower layer 7L. The thickness of the Ti oxide film is smaller than the Cu oxide film 8.

Herein, as the oxidation treatment, an $N_2O$ plasma treatment is performed, where $N_2O$ gas flow rate: 3000 sccm, pressure: 100 Pa, plasma power density: 1.0 W/cm$^2$, process time: 200 to 300 sec, substrate temperature: 200° C., for example. Thus, the Cu oxide film 8 is formed whose thickness (average thickness) is 20 nm, for example.

Note that the oxidation treatment is not limited to a plasma treatment using an $N_2O$ gas. For example, the oxidation treatment may be performed by a plasma treatment using an $O_2$ gas, an ozone treatment, etc., for example. In order to perform the treatment without increasing the number of steps, it is preferably performed immediately before the step of forming the interlayer insulating layer 11. Specifically, an $N_2O$ plasma treatment may be performed when the interlayer insulating layer 11 is formed by a CVD method, and an $O_2$ plasma treatment may be performed when the interlayer insulating layer 11 is formed by a sputtering method. Alternatively, the oxidation treatment may be performed by an $O_2$ plasma treatment using an ashing apparatus.

Next, as shown in FIGS. 6(a) and 6(b), the interlayer insulating layer 11 is formed so as to cover the oxide semiconductor TFT 101. The interlayer insulating layer 11 is arranged so as to be in contact with the Cu oxide film 8 and the channel region 5c.

With the semiconductor device 100B, the interlayer insulating layer 11 includes the first insulating layer 12 in contact with the channel region 5c of the oxide semiconductor layer 5, and the second insulating layer 13 arranged on the first insulating layer 12, for example.

The first insulating layer 12 may be an inorganic insulating layer such as a silicon oxide ($SiO_2$) film, a silicon nitride (SiNx) film, a silicon oxide nitride (SiOxNy; x>y) film, a silicon nitride oxide (SiNxOy; x>y) film, etc., for example. Herein, an $SiO_2$ layer whose thickness is 200 nm, for example, is formed as the first insulating layer 12 by a CVD method, for example.

Although not shown in the figures, a heat treatment (annealing treatment) may be performed on the entire substrate after the formation of the first insulating layer 12 and before the formation of the second insulating layer 13. There is no particular limitation on the temperature of the heat treatment, it may be 250° C. or more and 450° C. or less, for example.

The second insulating layer 13 may be an organic insulating layer, for example. Herein, a positive-type photosensitive resin film whose thickness is 2000 nm, for example, is formed, and the photosensitive resin film is patterned. Thus, an opening 13E through which the first insulating layer 12 is exposed is formed in an area located above the drain electrode 7D.

Note that the materials of these insulating layers 12 and 13 are not limited to the materials described above. The second insulating layer 13 may be an inorganic insulating layer, for example.

Next, as shown in FIGS. 7(a) and 7(b), the common electrode 15 is formed on the second insulating layer 13.

The common electrode 15 is formed as follows, for example. First, a transparent conductive film (not shown) is formed by a sputtering method, for example, on the second insulating layer 13 and in the opening 13E. Then, the transparent conductive film is patterned to form the opening 15E in the transparent conductive film. Photolithography methods known in the art can be used for the patterning. In this example, the opening 15E is arranged so that the opening 13E and the periphery thereof are exposed therethrough, as seen from the direction normal to the substrate 1. Thus, the common electrode 15 is obtained.

The transparent conductive film may be an ITO (indium tin oxide) film (thickness: 50 nm or more and 200 nm or less), an IZO film, a ZnO film (zinc oxide film), etc., for example. Herein, an ITO film whose thickness is 100 nm, for example, is used as the transparent conductive film.

Then, as shown in FIGS. 8(a) and 8(b), the third insulating layer 17 is formed by a CVD method, for example, on the common electrode 15, in the opening 15E of the common electrode 15 and in the opening 13E of the second insulating layer 13.

There is no particular limitation on the third insulating layer 17, which may suitably be a silicon oxide ($SiO_2$) film, a silicon nitride (SiNx) film, a silicon oxide nitride (SiOxNy; x>y) film, a silicon nitride oxide (SiNxOy; x>y) film, etc., for example. In the present embodiment, since the third insulating layer 17 is used also as a capacitive insulating film forming the storage capacitor, the material and the thickness of the third insulating layer 17 are preferably selected suitably so that a predetermined capacitance is obtained. The third insulating layer 17 may be an SiNx film or an $SiO_2$ film whose thickness is 100 nm or more and 400 nm or less, for example.

Next, as shown in FIGS. 9(a) and 9(b), an opening 17E through which the Cu oxide film 8 is exposed is formed in the third insulating layer 17 and the first insulating layer 12. As seen from the direction normal to the substrate 1, the opening 17E is arranged so as to be inside the opening 15E and to at least partially overlap with the opening 13E. Note that in the present specification, when the opening 13E, 15E, 17E is tapered, the shape of an opening as seen from the direction normal to the substrate 1 refers to the shape of the opening at the bottom thereof.

In this example, the third insulating layer 17 is arranged so as to cover the upper surface and the side surface of the common electrode 15 and a portion of the side surface of the opening 13E. Thus, the opening 13E in the second insulating layer 13, the opening 15E in the common electrode 15 and the opening 17E in the third insulating layer 17 together form the contact hole CH1 reaching the Cu oxide film 8.

There is no particular limitation on the method and conditions of the etching of the third insulating layer 17 and the first insulating layer 12. It may be done with a method and conditions such that the etching selectivity is sufficiently high between the first and third insulating layers 12 and 17 and the drain electrode 7D, and that at least a portion of the Cu oxide film 8 remains on the bottom surface of the contact hole CH1. Herein, the third insulating layer 17 and the first insulating layer 12 are etched simultaneously using a resist mask (not shown).

Then, the resist mask is removed using a resist stripping solution (e.g., an amine-based stripping solution). Note that the resist stripping solution may possibly remove a portion of the Cu oxide film 8 in the contact hole CH1, thereby thinning the Cu oxide film 8, as described above. Although not shown in the figure, the surface of the main layer 7a after the oxidation treatment may have irregularities due to thickness variations of the Cu oxide film 8. The surface irregularities are not reduced by the resist mask stripping solution. Therefore, even if it is brought into contact with the transparent conductive layer in this state, it is difficult to realize a desirable contact.

Next, as shown in FIGS. 10(a) and 10(b), a portion of the Cu oxide film 8 that is located in the contact hole CH1 is removed. Herein, the Cu oxide film 8 is removed by a cleaning treatment using a chelate cleaning solution. Thus, the surface of the drain electrode 7D (i.e., the surface of the main layer 7a) is exposed through the contact hole CH1. It is preferred that the Cu oxide film 8 is not exposed on the bottom surface of the contact hole CH1 but only the Cu surface (the main layer 7a) is exposed, as seen from the direction normal to the substrate 1. That is, it is preferred that the Cu oxide film 8 is not arranged in an area of the upper surface of the drain electrode 7D that overlaps with the opening of the first insulating layer 12, as seen from the direction normal to the substrate 1. A portion of the Cu oxide film 8 that is located at the interface between the interlayer insulating layer 11 and the source/drain electrode 7 and the source line S remains unremoved.

The chelate cleaning solution may be a mixed solution of hydrogen peroxide water, a basic chemical liquid and water (the main component), for example. The basic chemical liquid may be TMAH (Tetramethylammonium hydroxide), for example. The temperature of the cleaning solution may be 30° C. to 40° C., for example, and the cleaning time may be about 60 to 90 seconds, for example.

FIG. 10(c) schematically shows an example cross-sectional structure of the substrate 1 after chelate cleaning. As shown in the figure, chelate cleaning may etch (side etch) the Cu oxide film 8 in the lateral direction (the direction parallel to the substrate 1). In such a case, as seen from the direction normal to the substrate 1, in the contact hole CH1, the edge portion P(10) of the Cu oxide film 8 is located on the outer side with respect to the edge portion P(CH) of the interlayer insulating layer 11 by the amount of side etch ($\Delta x$). In other words, as seen from the direction normal to the substrate 1, the edge portion of the Cu oxide film 8 is located so as to surround the opening 17E of the interlayer insulating layer 11.

Chelate cleaning may remove not only the Cu oxide film 8 but also a portion of the surface portion (Cu) of the main layer 7a. This reduces the irregularities produced on the surface of the main layer 7a through the oxidation treatment, thereby flattening the contact surface. In such a case, as shown in FIG. 10(c), the surface of the main layer 7a to be the contact surface may be located below the surface thereof covered by the Cu oxide film 8.

Then, as shown in FIGS. 11(a) and 11(b), a transparent conductive film (not shown) is formed by a sputtering method, for example, in the contact hole CH1 and on the third insulating layer 17, and the transparent conductive film is patterned, thereby forming the transparent conductive layer 19. In the illustrated example, the transparent conductive layer 19 has a comb-shaped planar shape having a plurality of cut-outs. The transparent conductive layer 19 is in direct contact with the main layer 7a of the drain electrode 7D in the contact hole CH1. Thus, the semiconductor device 100B is manufactured.

The transparent conductive film for forming the transparent conductive layer 19 may be an ITO (indium-tin oxide) film (thickness: 50 nm or more and 150 nm or less), an IZO film, a ZnO film (zinc oxide film), or the like, for example. Herein, an ITO film whose thickness is 100 nm, for example, is used as the transparent conductive film.

While a two-layer electrode structure is formed, in which the pixel electrode is the upper layer, with the method described above, the transparent conductive layer 19 functioning as a pixel electrode may be provided as the lower layer, and the common electrode 15 may be formed thereon with the third insulating layer 17 interposed therebetween. Specifically, first, after the interlayer insulating layer 11 is formed, the first insulating layer 12 is etched using the second insulating layer 13 as a mask, thereby forming the contact hole CH1. Then, the Cu oxide film 8 located on the bottom surface of the contact hole CH1 is removed by chelate cleaning, thereby exposing the Cu surface. Then, the transparent conductive layer 19 is formed in the contact hole CH1 and on the second insulating layer 13. Thus, it is possible to provide the transparent conductive layer 19 so that it is in direct contact with the drain electrode 7D in the contact hole CH1.

Note that when the first insulating layer 12 is etched using the second insulating layer 13 as a mask, there is no stripping of a resist mask, and the Cu oxide film 8 located on the bottom surface of the contact hole CH1 is not thinned by a resist stripping solution. In such a case, if the Cu oxide film 8 is removed by chelate cleaning, it is possible to more effectively reduce the contact resistance.

When the semiconductor device 100A shown in FIG. 1 is manufactured, the contact hole CH1 may be formed in a portion of the interlayer insulating layer 11 that is located over the drain electrode 7D, after the formation of the interlayer insulating layer 11, so that the Cu oxide film 8 is exposed on the bottom surface of the contact hole CH1. When the first and second insulating layers 12 and 13 are formed as the interlayer insulating layer 11, the contact hole CH1 may be formed by etching the first insulating layer 12 using the second insulating layer 13 as a mask. Alternatively, the interlayer insulating layer 11 may be one inorganic insulating layer or two or more inorganic insulating layers. For example, an inorganic insulating layer (thickness: 200 nm, for example) such as a silicon oxide ($SiO_2$) layer, a silicon nitride (SiNx) layer, a silicon oxide nitride (SiOxNy; x>y) layer and a silicon nitride oxide (SiNxOy; x>y) layer may be included. Such an inorganic insulating layer may be formed by a CVD method, for example. The interlayer insulating layer 11 may have a layered structure including an $SiO_2$ layer and an SiNx layer, for example. When an inorganic insulating layer is formed as the interlayer insulating layer 11, a resist mask may be formed on the inorganic insulating layer and the contact hole CH1 may be formed in the interlayer insulating layer 11 using the resist mask. After the formation of the contact hole CH1, chelate cleaning is performed so as to expose the Cu surface (the main layer 7a). Then, the transparent conductive layer 19 is formed in the contact hole CH1 and on the interlayer insulating layer 11, thereby obtaining the semiconductor device 100A.

In the illustrated example, a portion (the channel region 5c) of the oxide semiconductor layer 5 is arranged so as to be laid over the gate electrode 3 with the gate insulating layer 4 interposed therebetween, as seen from the direction normal to the substrate 1. Note that the oxide semiconductor TFT 101 may be arranged so that the entirety thereof is laid over the gate electrode (gate line) 3.

Examples of Invention and Reference Examples

The present inventors studied the relationship between the presence/absence of chelate cleaning and the contact resistance, and the method and the results of the study will now be described.

The semiconductor device 100B was produced by the method described above, as an embodiment example. As a reference example, a semiconductor device was produced by a method similar to the method described above, except that chelate cleaning was not performed after the formation of the contact hole CH1.

Figure 12:
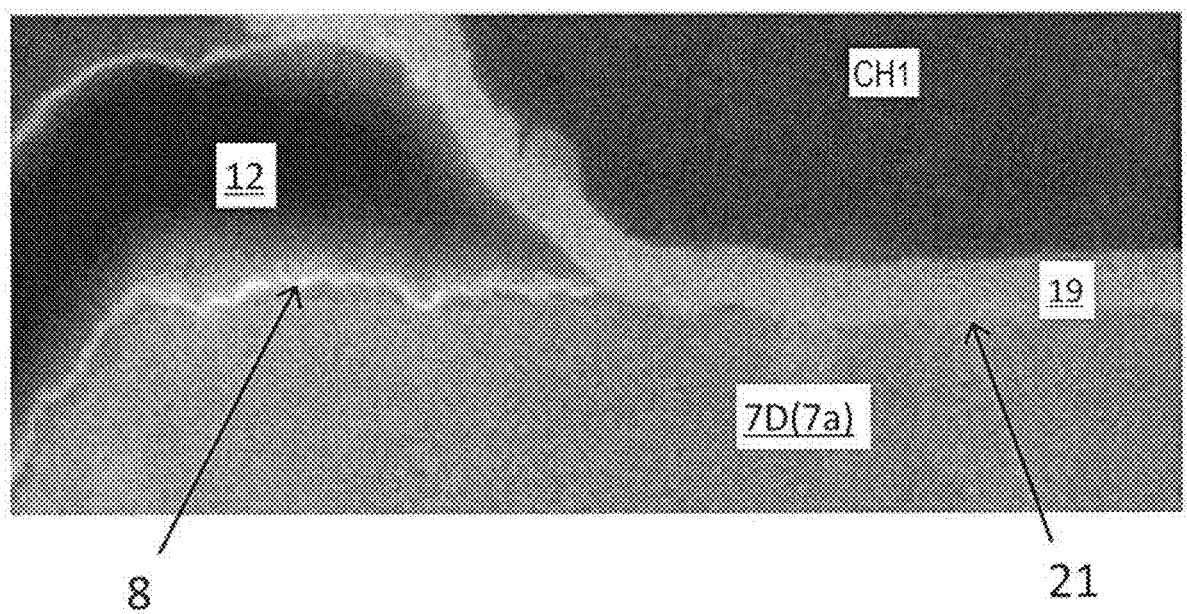
FIG. 12 An example cross-sectional SEM image of the contact portion between a drain electrode 7D and a transparent conductive layer 19 of a semiconductor device according to an embodiment example.

FIG. 12 illustrates a cross-sectional SEM image of the contact portion between the drain electrode 7D and the transparent conductive layer 19 of the semiconductor device according to an embodiment example.

It can be seen from FIG. 12 that a portion of the Cu oxide film 8 that is laid over the contact hole CH1 is entirely removed, and the main layer 7a of the drain electrode 7D and the transparent conductive layer 19 are in direct contact with each other in the contact hole CH1. The irregularities of the interface (contact surface) 21 between the main layer 7a of the drain electrode 7D and the transparent conductive layer 19 are less than the irregularities at the interface between the main layer 7a and the interlayer insulating layer 11 (herein, the first insulating layer 12) (i.e., the interface between the main layer 7a and the interlayer insulating layer 11 with the Cu oxide film 8 interposed therebetween). This indicates that the irregularities produced on a portion of the Cu surface that is to be the contact surface 21 are reduced and the portion is flattened by chelate cleaning in the oxidation treatment step.

Next, the contact resistance between the drain electrode 7D and the transparent conductive layer 19 of the semiconductor device of the embodiment example was compared with that of the reference example.

The semiconductor device of the embodiment example and that of the reference example each include a plurality of oxide semiconductor TFT 101 and a plurality of contact portions on the substrate 1. The drain electrode 7D of each oxide semiconductor TFT 101 is connected to the corresponding transparent conductive layer 19 in the contact portion. The present inventors measured the resistances of these contact portions (contact resistances) to obtain the average value Rave, the maximum value R max and the minimum value R min of the contact resistance.

Figure 13:
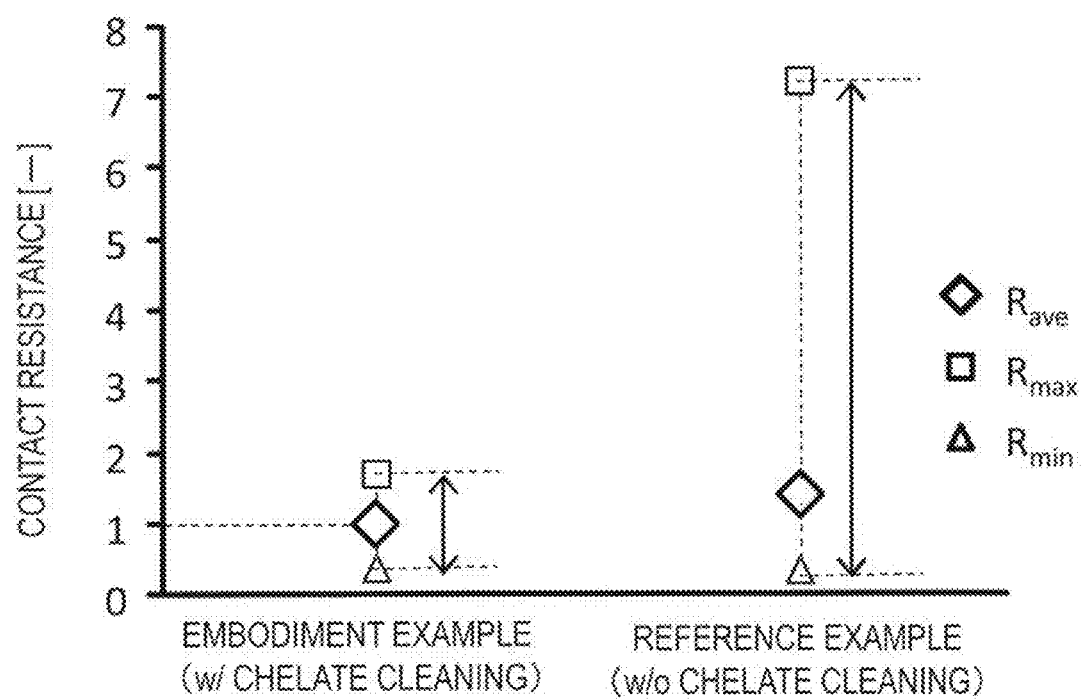
FIG. 13 A graph illustrating the contact resistance measurement results for semiconductor devices of an embodiment example and a reference example.

FIG. 13 is a graph showing the contact resistance measurement results for the semiconductor device of the embodiment example and that of the reference example. The contact resistance along the vertical axis represents a value of the contact resistance for the semiconductor device of the embodiment example, standardized with the average value Rave.

It can be confirmed from the results shown in FIG. 13 that the average value Rave of the contact resistance can be lowered more for the semiconductor device of the embodiment example with chelate cleaning than for the semiconductor device of the reference example. This is believed to be because the Cu oxide film 8 remains in the contact hole CH1 to be interposed between the drain electrode 7D and the transparent conductive layer 19 in the reference example, whereas the Cu oxide film 8 that is located in the contact hole CH1 is removed by chelate cleaning in the embodiment example.

It can also be seen that with the semiconductor device of the reference example, the difference between the maximum value R max and the minimum value R min of the contact resistance is large, and the contact resistance varies significantly across the substrate 1. This is believed to be due to the thickness variations of the Cu oxide film 8 located between the drain electrode 7D and the transparent conductive layer 19 and the surface irregularities of the drain electrode 7D produced through the oxidation treatment. In contrast, with the semiconductor device of the embodiment example, the contact resistance variations across the substrate 1 are reduced significantly. This is believed to be because the Cu oxide film 8 is not present interposed between the drain electrode 7D and the transparent conductive layer 19, and the surface irregularities of the contact surface of the drain electrode 7D are reduced.

Note that the minimum value R min of the contact resistance for the semiconductor device of the embodiment example is about the same as that for the semiconductor device of the reference example. Thus, it is believed that for some contact portions of the semiconductor device of the reference example, a portion (surface portion) of the Cu oxide film 8 in the contact hole CH1 was removed by the resist mask stripping solution, thereby thinning the Cu oxide film 8 to such an extent that the contact resistance could be ignored. With a resist mask stripping solution, however, it is difficult to evenly and sufficiently thin the Cu oxide film 8 in the contact hole CH1 across the entire substrate 1. Therefore, there are contact portions having contact resistances that are five times or more the average value Rave, for example. In contrast, with the semiconductor device of the embodiment example, it is possible to remove the Cu oxide film 8 in the contact hole CH1 across the entire substrate 1. It is possible to suppress the contact resistance variations to about 25% or less, for example.

<Alignment Mark>

In the process of manufacturing the semiconductor devices 100A and 100B, an alignment mark may be provided on the substrate for alignment of a mask. An alignment mark is formed using the same conductive film (source wiring layer) as the source/drain electrode 7, for example. The alignment mark is read based on the reflectance as the alignment mark is irradiated with light, for example.

Figure 14:
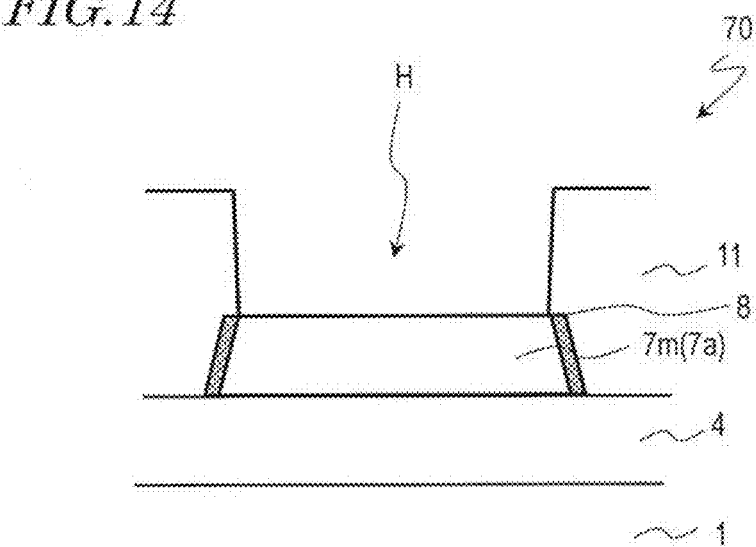
FIG. 14 A cross-sectional view illustrating an alignment mark portion 70 according to the first embodiment.

FIG. 14 is a cross-sectional view showing an example alignment mark portion 70 used in the present embodiment.

The alignment mark portion 70 includes a mark layer 7m formed by using the same conductive film as the source/drain electrode 7, for example. The mark layer 7m includes the main layer 7a whose main component is Cu. It may include a lower layer on the substrate 1 side of the main layer 7a. The interlayer insulating layer 11 is provided extending over the mark layer 7m. The interlayer insulating layer 11 has an opening H over at least a portion of the upper surface of the mark layer 7m. In this example, the opening H is arranged so that the entire upper surface of the mark layer 7m is exposed. The interlayer insulating layer 11 is in contact with the side surface of the mark layer 7m with the Cu oxide film 8 interposed therebetween. In a portion of the mark layer 7m that is exposed through the opening H, i.e., a portion of the upper surface of the mark layer 7m that overlaps with the opening H as seen from the direction normal to the substrate 1, the Cu oxide film 8 is not formed and the main layer 7a is exposed.

The formation of the alignment mark portion 70 can be a shared process with the method described above with reference to FIG. 3 to FIG. 11. Specifically, after the mark layer 7m is formed by patterning the source line metal film, the upper surface and the side surface of the mark layer 7m are oxidized in the oxidation treatment step for the oxide semiconductor layer 5, thereby forming the Cu oxide film 8. Then, after the formation of the interlayer insulating layer 11, the opening H is formed over the mark layer 7m in the step of patterning the interlayer insulating layer 11. Then, when the Cu oxide film 8 in the contact hole CH1 is removed by chelate cleaning, the Cu oxide film 8 in the opening H is also removed. Note that the opening H may be arranged so that the entire mark layer 7m is exposed. In such a case, the Cu oxide film 8 on the upper surface and the side surface of the mark layer 7m may be entirely removed by chelate cleaning.

As described above with reference to FIG. 10(c), when the Cu oxide film 8 is removed by chelate cleaning, the edge portion of the Cu oxide film 8 may be located on the outer side with respect to the edge portion of the interlayer insulating layer 11 defining the opening H, as seen from the direction normal to the substrate 1.

With a conventional semiconductor device, when an alignment mark is formed using Cu wiring, if a Cu oxide film is formed on the upper surface of the alignment mark, the irradiating light may possibly be diffused or absorbed due to oxidization and discoloration of Cu, resulting in an alignment mark read error. In contrast, in the present embodiment, since the Cu oxide film 8 on the upper surface of the mark layer 7m is removed, it is possible to suppress a read error due to the Cu oxide film 8. Since the surface irregularities of the mark layer 7m can be reduced, it is possible to obtain the alignment mark portion 70 having a better readability.

In the present embodiment, at least one of the alignment mark portion 70 described above is formed on the substrate 1. The alignment mark portion 70 may be present on the substrate 1 of the semiconductor devices 100A and 100B after completion of the finished product or may be separated or removed before completion of the finished product.

<Terminal Portion>

In the semiconductor devices 100A and 100B, the wiring layer (referred to as the source wiring layer) including the source/drain electrode 7 may have a layered structure as described above. The surface (the upper surface and the side surface) of the source wiring layer may be covered by the Cu oxide film 8. In a portion (e.g., a terminal portion, etc.) of the source wiring layer that forms a contact with another conductive layer, it is preferred that the Cu oxide film 8 is removed as with the contact portion between the drain electrode 7D and the transparent conductive layer 19 described above. Thus, it is possible to suppress in increase of the contact resistance.

The semiconductor devices 100A and 100B may include a terminal portion, or the like, that is configured to electrically connect a source connection layer formed from the same film as the source line S with an upper conductive layer formed from the same film as the transparent conductive layer 19. In such a case, it is preferred that the Cu oxide film 8 of the contact surface between the source connection layer and the transparent conductive layer has been selectively removed. The Cu oxide film 8 of the contact surface can be removed simultaneously with the Cu oxide film 8 on the drain electrode 7D in the chelate cleaning step described above.

For example, the semiconductor devices 100A and 100B may include a source terminal portion for connecting, in the contact hole provided in the interlayer insulating layer 11, the source connection layer formed integral with the source line S with the upper conductive layer formed from the same film as the transparent conductive layer 19. With the source terminal portion, it is preferred that the Cu oxide film 8 formed on the upper surface of the source connection layer is removed in the contact hole of the interlayer insulating layer 11, and the source connection layer and the upper conductive layer are in direct contact with each other in the contact hole of the interlayer insulating layer 11.

It may include a gate terminal portion for connecting together the gate connection layer formed integral with the gate line G and the upper conductive layer formed from the same film as the transparent conductive layer 19. The gate connection layer and the upper conductive layer may be connected together, in the contact hole provided in the interlayer insulating layer 11, via a source connection layer formed from the same film as the source line S.

The structure of a terminal portion will now be described using a gate terminal portion as an example. FIGS. 15(a) and 15(b) are a cross-sectional view and a plan view, respectively, illustrating a gate terminal portion. Like elements to those of FIG. 1 are denoted by like reference signs. FIG. 15(a) shows a cross section taken along line II-II' of FIG. 15(b).

A gate terminal portion 80 includes a gate connection layer 3t formed on the substrate 1, the gate insulating layer 4 is provided extending over the gate connection layer 3t, a source connection layer 7t, the interlayer insulating layer 11 provided extending over the source connection layer 7t, and an upper conductive layer 19t. The source connection layer 7t is formed from the same conductive film as the source line S, and is electrically separated from the source line S. The source connection layer 7t is arranged in the opening provided in the gate insulating layer 4 so as to be in contact with the gate connection layer 3t. The upper conductive layer 19t is arranged in a contact hole CH2 provided in the interlayer insulating layer 11 so as to be in contact with the source connection layer 7t. The source connection layer 7t includes a Cu layer, and a portion of the upper surface of the source connection layer 7t is covered by the Cu oxide film 8. In this example, the Cu oxide film 8 is arranged also on the side surface of the source connection layer 7t. In the contact hole CH2 formed in the interlayer insulating layer 11, the Cu oxide film 8 is removed, and the upper conductive layer 19t and the upper surface (Cu surface) of the source connection layer 7t. That is, the Cu oxide film 8 is present interposed between the source connection layer 7t and the interlayer insulating layer 11, and is not present interposed between the source connection layer 7t and the upper conductive layer 19t. Thus, it is possible to suppress the contact resistance between the gate connection layer 3t and the upper conductive layer 19t.

The gate terminal portion 80 can be manufactured as follows. First, a source wiring layer including the gate connection layer 3t, the gate insulating layer 4, an oxide semiconductor layer (not shown) and the source connection layer 7t is formed. The source connection layer 7t is arranged in the opening of the gate insulating layer 4 so as to be in contact with the gate connection layer 3t. Then, an oxidation treatment is performed on the oxide semiconductor layer. In this process, the surface (Cu surface) of the source connection layer 7t is oxidized, forming the Cu oxide film 8. Then, the interlayer insulating layer 11 is formed covering the source wiring layer, and the contact hole CH2 through which the Cu oxide film 8 is exposed is provided in the interlayer insulating layer 11. Then, a portion of the Cu oxide film 8 that is exposed through the contact hole CH2 is removed by chelate cleaning, or the like. Then, the upper conductive layer 19t is provided in the contact hole CH2 so as to be in contact with the source connection layer 7t.

The structure of the terminal portion is not limited to the example shown in the figure. In either the source terminal portion or the gate terminal portion, the advantageous effects described above can be realized as long as the interlayer insulating layer 11 is in contact with the source connection layer 7t with the Cu oxide film 8 interposed therebetween and the upper conductive layer 19t is in direct contact with the source connection layer 7t in the contact hole CH2 without the Cu oxide film 8 interposed therebetween.

In addition to the terminal portions, the semiconductor devices 100A and 100B may include a source-gate connection layer for connecting together the source line S and the gate line G via a conductive layer that is formed from the same film as the transparent conductive layer 19. Also with the source-gate connection layer, the Cu oxide film 8 on the source line S may be removed in the contact hole provided in the interlayer insulating layer 11 so that the source line S and the conductive layer are in direct contact with each other, as described above.

Second Embodiment

A second embodiment of a semiconductor device according to the present invention will now be described. The semiconductor device of the present embodiment is different from the first embodiment in that a Cu alloy oxide film is formed on the surface of the source and drain electrodes.

FIGS. 16(a) and 16(b) are a schematic cross-sectional view and a schematic plan view, respectively, showing the semiconductor device 200A of the present embodiment. FIG. 16(a) shows a cross section taken along line III-III' of FIG. 16(b). In FIG. 16, like elements to those of FIG. 1 are denoted by like reference signs and will not be discussed below.

The semiconductor device 200A includes an oxide semiconductor TFT 201 and the transparent conductive layer 19 electrically connected to the oxide semiconductor TFT 201.

The oxide semiconductor TFT 201 includes the gate electrode 3 supported on the substrate 1, the gate insulating layer 4 covering the gate electrode 3, the oxide semiconductor layer 5 arranged so as to be laid over the gate electrode 3 with the gate insulating layer 4 interposed therebetween, the source electrode 7S and the drain electrode 7D (the source/drain electrode 7), and a Cu alloy oxide film 10 arranged on the upper surface of the source/drain electrode 7.

The source/drain electrode 7 of the present embodiment includes the main layer 7a including Cu as the main component, and an upper layer 7U provided on the main layer 7a. The upper layer 7U includes a Cu alloy. The source/drain electrode 7 may include the lower layer 7L arranged on the substrate 1 side of the main layer 7a. The lower layer 7L may be arranged so as to be in contact with the oxide semiconductor layer 5. The lower layer 7L may include titanium (Ti) or molybdenum (Mo), for example.

The Cu alloy oxide film 10 includes Cu and a metal element other than Cu. Typically, it includes CuO, $Cu_2O$ and oxides of the metal elements above. The Cu alloy oxide film 10 may be formed in contact with the upper surface of the source/drain electrode 7 (herein, the upper surface of the upper layer 7U). The Cu alloy oxide film 10 may be an oxide film that is formed by oxidizing the upper surface (Cu alloy surface) of the source/drain electrode 7. Alternatively, it may be a film that is deposited by a sputtering method, or the like, for example.

The interlayer insulating layer 11 is arranged so as to be in contact with the channel region 5c of the oxide semiconductor layer 5. In this example, the interlayer insulating layer 11 is arranged so as to cover the source electrode 7S and the drain electrode 7D with the Cu alloy oxide film 10 interposed therebetween. The contact hole CH1, which reaches the surface of the drain electrode 7D (herein, the surface of the upper layer 7U), is formed in the interlayer insulating layer 11. The Cu alloy oxide film 10 is not arranged on the bottom surface of the contact hole CH1, and the surface of the drain electrode 7D is exposed.

The transparent conductive layer 19 is provided on the interlayer insulating layer 11 and in the contact hole CH1. In the contact hole CH1, the transparent conductive layer 19 is in direct contact with the drain electrode 7D (herein, the upper layer 7U) without the Cu alloy oxide film 10 interposed therebetween. The transparent conductive layer 19 is a pixel electrode, for example.

The source/drain electrode 7 of the present embodiment is only required to have a layered structure including the main layer 7a and the upper layer 7U, and may further include other conductive layers. Alternatively, the source/drain electrode 7 of the present embodiment does not need to include a Cu alloy layer.

The main layer 7a and the lower layer 7L of the source/drain electrode 7 may be similar to the main layer 7a and the lower layer 7L described above with reference to FIG. 1 and FIG. 2.

The upper layer 7U of the source/drain electrode 7 is only required to be a layer whose main component is a Cu alloy (a Cu alloy layer), and may include impurities. There is no particular limitation on the type and quantity of the metal element (referred to as an "additive metal element") which forms an alloy with Cu.

It is preferred that a metal element that by nature is more likely to be oxidized than Cu is included as the additive metal element of the Cu alloy. For example, at least one metal element selected from the group consisting of Mg, Al, Ca, Ti, Mo and Mn may be included as the additive metal element. Then, it is possible to more effectively suppress oxidization of Cu. The proportion of the additive metal element with respect to the Cu alloy (if two or more additive metal elements are included, the proportion of each additive metal element) may be more than 0 at % and 10 at % or less. Preferably, it is 1 at % or more and 10 at % or less. When it is 1 at % or more, it is possible to sufficiently suppress oxidization of Cu, and when it is 10 at % or less, it is possible to more effectively suppress Cu oxidization. When two or more metal elements are added, the total proportion thereof may be 0 at % or more and 20 at % or less, for example. Then, it is possible to more reliably suppress oxidization of Cu. The Cu alloy may be CuMgAl (Mg: 0 to 10 at %, Al: 0 to 10 at %), CuCa (Ca: 0 to 10 at %), etc., for example.

The Cu alloy oxide film 10 of the present embodiment is an oxide film formed through oxidization of the upper surface of the source/drain electrode 7 (herein, the surface of the Cu alloy layer which is the upper layer 7U) during the oxidation treatment performed on the channel region 5c of the oxide semiconductor layer 5. In such a case, the Cu alloy oxide film 10 includes CuO and an oxide of an additive metal element included in the Cu alloy of the upper layer 7U. For example, when a CuMgAl layer is used as the upper layer 7U, the Cu alloy oxide film 10 may include CuO, MgO and $Al_2O_3$. These metal oxides coexist in the Cu alloy oxide film 10, for example. The composition and thickness of the Cu alloy oxide film 10 can be examined by the Auger analysis, for example.

Note that the oxidation treatment may also oxidize the side surface of the source/drain electrode 7, forming the Ti oxide film 9 on the side surface of the lower layer 7L, the Cu oxide film 8 on the side surface of the main layer 7a, and the Cu alloy oxide film 10 on the side surface of the upper layer 7U.

There is no particular limitation on the thickness (average value) of the Cu alloy oxide film 10, which varies depending on the composition of the surface of the source/drain electrode 7, and the oxidation treatment method and conditions thereof, etc., but it is for example 10 nm or more and 100 nm or less, and preferably 10 nm or more and 50 nm or less. As an example, when the Cu layer is oxidized by an $N_2O$ plasma treatment (e.g., $N_2O$ gas flow rate: 3000 sccm, pressure: 100 Pa, plasma power density: 1.0 W/cm$^2$, process time: 200 to 300 sec, substrate temperature: 200° C.), the thickness of the Cu alloy oxide film 10 (Cu oxide film) is for example 10 nm or more and 50 nm or less, and more preferably 10 nm or more and 40 nm or less. Note that the thickness of the Cu alloy oxide film 10 obtained through oxidization of a Cu alloy surface is smaller than the thickness of a Cu oxide film that is formed when a Cu surface is oxidized under the same conditions.

The Cu alloy oxide film 10 is removed from the surface of the drain electrode 7D in the contact hole CH1. As with the removal of the Cu oxide film in the embodiment described above, a portion of the Cu alloy oxide film 10 that is located on the bottom surface of the contact hole CH1 can be selectively removed by performing chelate cleaning, for example.

There is no particular limitation on the method for forming the Cu alloy oxide film 10. The Cu alloy oxide film 10 may be a sputtered film that is formed by using a Cu alloy as the target in an oxygen-containing atmosphere (e.g., in an argon/oxygen atmosphere), for example. The Cu alloy oxide film 10 obtained by this method includes an oxide of a metal included in the Cu alloy target, irrespective of the material of the source/drain electrode 7. Also in such a case, a portion of the Cu alloy oxide film 10 that is located on the bottom surface of the contact hole CH1 can be selectively removed by performing chelate cleaning after the formation of the contact hole CH1.

The semiconductor device 200A is applicable to active matrix substrates of display devices, for example, as is the embodiment described above. For example, the semiconductor device 200A is applicable to display devices of vertical electric field drive schemes such as the VA mode. The source line S of the active matrix substrate may be formed integral with the source electrode 7S of the oxide semiconductor TFT 201. That is, the source line S includes the main layer 7a whose main component is Cu and the upper layer 7U including a Cu alloy, and the Cu alloy oxide film 10 may be formed also on the upper surface and the side surface of the source line S as with the source/drain electrode 7.

The semiconductor device of the present embodiment may further include another electrode layer that functions as a common electrode on a transparent conductive layer (pixel electrode) 19 or between the interlayer insulating layer 11 and the transparent conductive layer 19. Thus, a semiconductor device having two transparent electrode layers is obtained. Such a semiconductor device is applicable to display devices of the FFS mode, for example.

Figure 17:
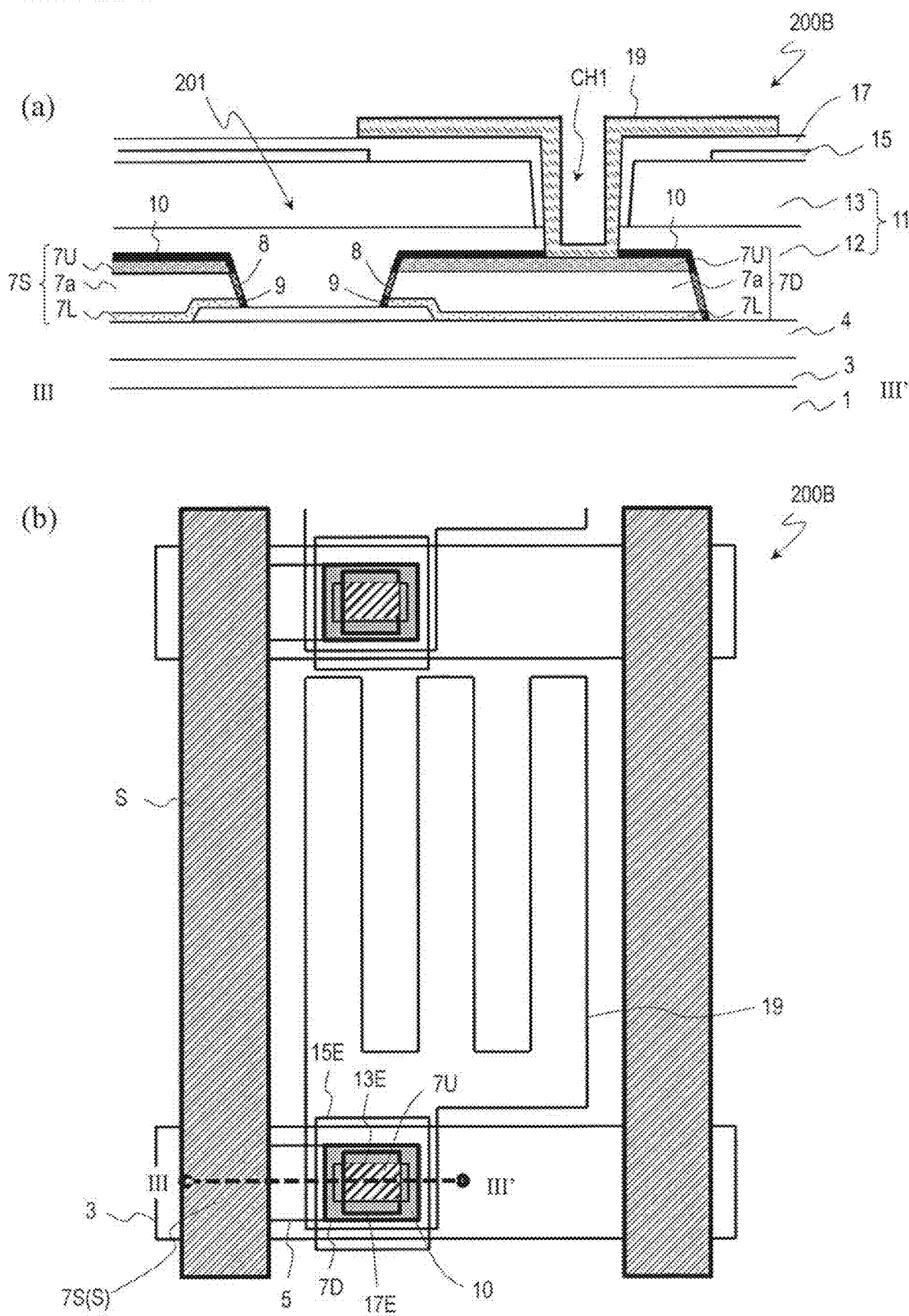
FIGS. 17 (a) and (b) are a schematic cross-sectional view and a schematic plan view, respectively, showing another semiconductor device 200B according to the second embodiment.
Figure 24:
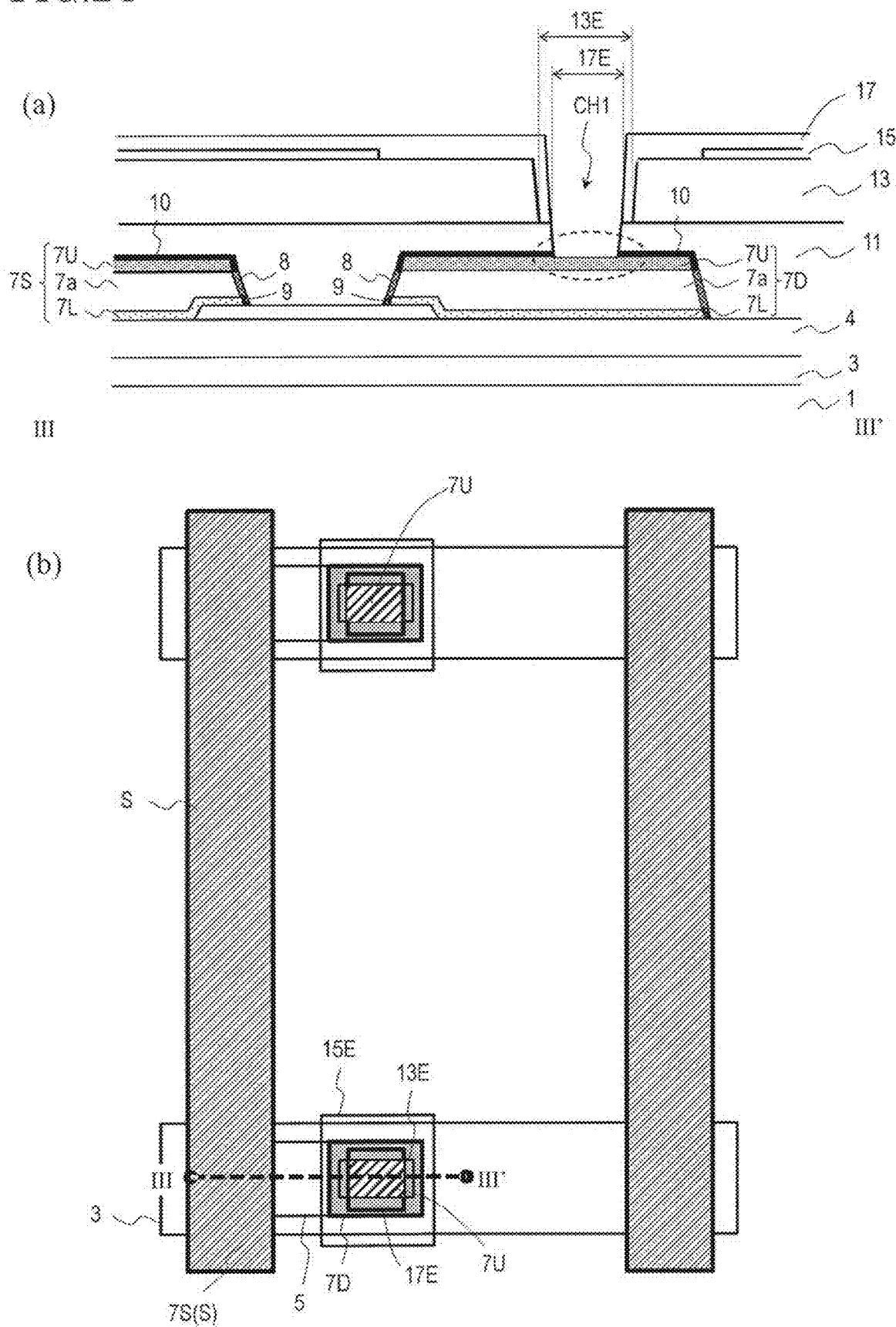
FIGS. 24 (a) and (b) are a cross-sectional view and a plan view, respectively, of a process step illustrating an example method for manufacturing the semiconductor device 200B.

FIGS. 17(a) and 17(b) are a schematic cross-sectional view and a schematic plan view, respectively, showing another semiconductor device (active matrix substrate) 200B of the present embodiment. FIG. 17(b) shows one pixel in the display region. FIG. 17(a) is a cross-sectional view taken along line III-III' of the plan view shown in FIG. 17(b). In FIG. 17, like elements to those of the semiconductor device 100B (FIG. 2) and the semiconductor device 200A (FIG. 16) are denoted by like reference signs and will not be discussed below.

The semiconductor device 200B includes the common electrode 15 arranged, between the interlayer insulating layer 11 and the transparent conductive layer (pixel electrode) 19, so as to oppose the pixel electrode 19. The third insulating layer 17 is formed between the common electrode 15 and the pixel electrode 19. The interlayer insulating layer 11 includes the first insulating layer 12 in contact with the oxide semiconductor layer 5 and the second insulating layer 13 formed on the first insulating layer 12. The materials and structures of the common electrode 15, the first insulating layer 12, the second insulating layer 13 and the third insulating layer 17 may be similar to those of the semiconductor device 100B shown in FIG. 2.

The common electrode 15 has the opening 15E for each pixel, and a contact portion between the pixel electrode 19 and the drain electrode 7D of the oxide semiconductor TFT 201 may be formed in the opening 15E. In this example, in the contact hole CH1, the pixel electrode 19 and the upper layer 7U of the drain electrode 7D are in direct contact with each other without the Cu alloy oxide film 10 interposed therebetween. Alternatively, the pixel electrode 19 and the drain electrode 7D may be connected together by a transparent connection layer formed from the same conductive film (transparent conductive film) as the common electrode 15. In such a case, in the contact hole CH1, the transparent connection layer and the upper layer 7U of the drain electrode 7D are in direct contact with each other.

Although not shown in the figure, the common electrode 15 is arranged on the pixel electrode 19 with the third insulating layer 17 interposed therebetween.

As in the embodiment described above, at least a portion of the pixel electrode 19 may be laid over the common electrode 15 with the third insulating layer 17 interposed therebetween, as seen from the direction normal to the substrate 1. Thus, a capacitor using the third insulating layer 17 as a dielectric layer is formed in an area where the pixel electrode 19 and the common electrode 15 are laid over each other. Instead of the common electrode 15, a transparent conductive layer that opposes the pixel electrode 19 and functions as a storage capacitor electrode may be provided, forming a storage capacitor in the pixel. Such a semiconductor device is applicable also to display devices of operation modes other than the FFS mode.

According to the present embodiment, advantageous effects similar to those of the semiconductor devices 100A and 100B (FIG. 1, FIG. 2) are realized as will be described below.

With the semiconductor devices 200A and 200B, a portion of the upper surface of the drain electrode 7D is covered by the Cu alloy oxide film 10. The interlayer insulating layer 11 covers the drain electrode 7D with the Cu alloy oxide film 10 interposed therebetween. On the other hand, in the contact hole CH1, the transparent conductive layer 19 is in direct contact with the drain electrode 7D (herein, the upper layer 7U) without the Cu alloy oxide film 10 interposed therebetween. With such a configuration, it is possible to suppress the contact resistance between the transparent conductive layer 19 and the drain electrode 7D. Thus, it is possible to suppress an increase in the contact resistance due to the Cu alloy oxide film 10 produced on the electrode surface through the oxidation treatment described above, while ensuring the TFT characteristics by the oxidation treatment performed on the oxide semiconductor layer 5, for example.

Also in the present embodiment, advantageous effects similar to those described above with reference to FIGS. 12 and 13 are realized by performing chelate cleaning. The thickness of the Cu alloy oxide film 10 formed by the oxidation treatment is likely to vary. Therefore, irregularities may be produced at the interface between the drain electrode 7D and the Cu alloy oxide film 10. Also in such a case, by performing chelate cleaning, in the contact hole CH1, it is possible to remove not only the Cu alloy oxide film 10 but also the surface portion of the drain electrode 7D (herein, the upper layer 7U), thereby flattening the surface of the drain electrode 7D. As a result, the interface between the drain electrode 7D and the transparent conductive layer 19 becomes flatter than the interface between the drain electrode 7D (the upper layer 7U) and the interlayer insulating layer 11 (i.e., the interface between the drain electrode 7D and the interlayer insulating layer 11 with the Cu alloy oxide film 10 interposed therebetween). Thus, it is possible to more significantly reduce the contact resistance between the drain electrode 7D and the transparent conductive layer 19. Since it is possible to reduce the variations of the contact resistance across the substrate 1, it is possible to increase the reliability. Moreover, it is possible to more effectively increase the adhesion of the transparent conductive layer 19 to the drain electrode 7D.

Note that when a portion of the surface of the drain electrode 7D that is located on the bottom surface of the contact hole CH1 is flattened by chelate cleaning, it may be located below the other portion that is covered by the Cu alloy oxide film 10. When the Cu alloy oxide film 10 is removed by chelate cleaning, the etching of the Cu alloy oxide film 10 may also proceed in the lateral direction (side etch). In such a case, as seen from the direction normal to the substrate 1, the edge portion of the Cu alloy oxide film 10 is located on the outer side with respect to the outline of the contact hole CH1 (the edge portion of the interlayer insulating layer 11).

Moreover, the semiconductor devices 200A and 200B have advantages as follows, as compared with the embodiment in which the Cu oxide film 8 is provided on the upper surface of the source/drain electrode 7 (the semiconductor devices 100A and 100B).

In the semiconductor devices 200A and 200B, the upper layer 7U including a Cu alloy is formed on the main layer 7a. Therefore, as compared with the embodiment described above, oxidization of Cu less easily proceeds during the oxidation treatment. This is because not only Cu but also a metal element added to Cu is oxidized during the oxidation treatment. If a metal element that is more easily oxidized than Cu is included, it is possible to more effectively suppress oxidization of Cu. As a result, it is possible to effectively suppress corrosion of an electrode due to oxidization of Cu. Moreover, it is possible to ensure a high adhesion with the interlayer insulating layer 11. Furthermore, when the oxidation treatment is performed under the same conditions, the thickness of the Cu alloy oxide film 10 that is obtained through oxidization of a Cu alloy surface is smaller than the thickness of the Cu oxide film that is obtained through oxidization of a Cu surface. Therefore, it is possible to reduce the irregularities produced on the surface of the drain electrode 7D through the oxidation treatment. It is also possible to more easily remove the Cu alloy oxide film 10, and it is possible to reduce the amount of side etch of the Cu alloy oxide film 10.

Moreover, with a conventional semiconductor device, when an alignment mark is formed using Cu wiring, the upper surface (Cu surface) of the alignment mark may be oxidized and discolored, resulting in an alignment mark read error. In contrast, according to the present embodiment, since the Cu alloy oxide film 10 is formed on the upper surface of the alignment mark, discoloration as described above does not occur. Therefore, it is possible to form an alignment mark having a high readability.

Thus, in the present embodiment, it is possible to suppress the lowering of a device characteristic (an increase in the ON resistance) due to an increase in the contact resistance between the drain electrode 7D and the transparent conductive layer 19, while suppressing oxidization and discoloration of Cu.

<Manufacturing Method>

Then, a method for manufacturing the semiconductor device of the present embodiment will be described using a method for manufacturing the semiconductor device 200B as an example. Note that the materials, thicknesses and method of formation of the layers of the semiconductor device 200B will not be described below wherever they are similar to those of the semiconductor devices 100A and 100B.

FIG. 18 to FIG. 24 illustrate an example method for manufacturing the semiconductor device 200B, wherein (a) is a cross-sectional view taken along line III-III', and (b) is a plan view.

First, as shown in FIGS. 18(a) and 18(b), a gate line (not shown) including the gate electrode 3, the gate insulating layer 4 and the oxide semiconductor layer 5 are formed in this order on the substrate 1. A portion (the channel region 5c) of the oxide semiconductor layer 5 is arranged so as to be laid over the gate electrode 3 with the gate insulating layer 4 interposed therebetween, as seen from the direction normal to the substrate 1. As shown in the figure, the oxide semiconductor layer 5 may be arranged so that the entirety thereof is laid over the gate electrode (gate line) 3.

Then, a source line metal film (not shown) is formed on the gate insulating layer 4 and the oxide semiconductor layer 5. Herein, as the source line metal film, a layered film is formed including a Ti- or Mo-containing film (e.g., a Ti film), a Cu film and a Cu alloy film (e.g., a CuMgAl film) in this order from the substrate 1 side. The source line metal film may be formed by a sputtering method, for example. The Cu alloy film may be formed by using a target made of a Cu alloy.

The thickness upon deposition of the Cu alloy film to be the upper layer 7U is preferably 10 nm or more and 100 nm or less. When it is 10 nm or more, it is possible, in a later step, to form a Cu alloy oxide film capable of sufficiently suppressing oxidization of Cu. Note that the thickness of the upper layer 7U upon completion of the finished product is smaller than that upon deposition by the amount that is consumed for the formation of the Cu alloy oxide film 10.

The material and thickness of the film to be the lower layer 7L and the main layer 7a may be similar to those of the embodiment described above.

Then, the source line metal film is patterned to obtain the source electrode 7S, the drain electrode 7D and the source line S, as shown in FIGS. 19(a) and 19(b). The source electrode 7S is arranged so as to be in contact with the source contact region of the oxide semiconductor layer 5, and the drain electrode 7D is arranged so as to be in contact with the drain contact region of the oxide semiconductor layer 5. A portion of the oxide semiconductor layer 5 that is located between the source electrode 7S and the drain electrode 7D is to be the channel region.

In this example, the source electrode and the drain electrode 7 have a layered structure including the lower layer (Ti layer) 7L in contact with the oxide semiconductor layer 5, the main layer (pure Cu layer) 7a and the upper layer (Cu alloy layer) 7U. The upper surface of the source electrode 7S and that of the drain electrode 7D are the upper layer 7U.

Then, as shown in FIGS. 20(a) and 20(b), the oxidation treatment is performed on the channel region of the oxide semiconductor layer 5. This also oxidizes the surface of the upper layer 7U of the source/drain electrode 7, thereby forming the Cu alloy oxide film (thickness: 10 nm, for example) 10. When the upper layer 7U is a CuMgAl layer, the Cu alloy oxide film 10 may include CuO, $Cu_2O$, MgO and $Al_2O_3$. When the upper layer 7U is a CuCa layer, the Cu alloy oxide film 10 may include CuO, $Cu_2O$ and CaO.

Herein, as the oxidation treatment, an $N_2O$ plasma treatment is performed, where $N_2O$ gas flow rate: 3000 sccm, pressure: 100 Pa, plasma power density: 1.0 W/cm2, process time: 200 to 300 see, substrate temperature: 200° C., for example. Thus, the Cu alloy oxide film 10 is formed whose thickness is 10 nm, for example. Note that there is no particular limitation on the method and conditions of the oxidation treatment. Other oxidation treatments illustrated in the embodiment described above may be performed.

The oxidation treatment step also oxidizes the exposed side surface of the source/drain electrode 7. As a result, the Ti oxide film 9 may be formed on the side surface of the lower layer 7L, the Cu oxide film 8 on the side surface of the main layer 7a, and the Cu alloy oxide film 10 on the side surface of the upper layer 7U. In this example, the thickness of the Cu oxide film 8 is greater than the thickness of the Cu alloy oxide film 10, and is 20 nm, for example. The thickness of the Ti oxide film 9 is smaller than the thickness of the Cu alloy oxide film 10.

Note that there is no particular limitation on the method of formation of the Cu alloy oxide film 10. The Cu alloy oxide film 10 may be a sputtered film formed in an oxygen-containing atmosphere, for example.

Next, as shown in FIGS. 21(a) and 21(b), the interlayer insulating layer 11 is formed so as to cover the oxide semiconductor TFT 201. The interlayer insulating layer 11 includes the first insulating layer 12 in contact with the channel region of the oxide semiconductor layer 5, and the second insulating layer 13 arranged on the first insulating layer 12, for example. The material, thickness and method of formation of the interlayer insulating layer 11 may be similar to those of the semiconductor device 100B. The opening 13E through which the first insulating layer 12 is exposed is formed in an area of the second insulating layer 13 that is located above the drain electrode 7D.

Then, as shown in FIGS. 22(a) and 22(b), the common electrode 15 and the third insulating layer 17 are formed on the second insulating layer 13. The common electrode 15 has the opening 15E. The opening 15E is arranged so as to at least partially overlap with the opening 13E. The materials, thicknesses and method of formation of the common electrode 15 and the third insulating layer 17 may be similar to those of the semiconductor device 100B.

Then, as shown in FIGS. 23(a) and 23(b), the opening 17E through which the Cu alloy oxide film 10 is exposed is formed in the third insulating layer 17 and the first insulating layer 12. As seen from the direction normal to the substrate 1, the opening 17E is arranged so as to be inside the opening 15E and to at least partially overlap with the opening 13E. In this example, the third insulating layer 17 is arranged so as to cover the upper surface and the side surface of the common electrode 15 and a portion of the side surface of the opening 13E. Thus, the opening 13E of the second insulating layer 13, the opening 15E of the common electrode 15 and the opening 17E of the third insulating layer 17 together form the contact hole CH1. The Cu alloy oxide film 10 is exposed on the bottom surface of the contact hole CH1.

There is no particular limitation on the method and conditions of the etching of the third insulating layer 17 and the first insulating layer 12. It may be done with a method and conditions such that the etching selectivity is sufficiently high between the first and third insulating layers 12 and 17 and the drain electrode 7D, and that at least a portion of the Cu alloy oxide film 10 remains on the bottom surface of the contact hole CH1. Herein, the third insulating layer 17 and the first insulating layer 12 are etched simultaneously using a resist mask.

Note that as in the embodiment described above, when the resist mask is stripped, a portion of the Cu alloy oxide film 10 in the contact hole CH1 may be removed depending on the type of the stripping solution. However, it is difficult to remove the entirety of the Cu alloy oxide film 10 exposed on the bottom surface of the contact hole CH1. While irregularities are produced on the surface of the source/drain electrode 7 through the oxidation treatment, the surface irregularities are not reduced by the resist stripping solution.

Then, as shown in FIGS. 24(a) and 24(b), a portion of the Cu alloy oxide film 10 that is located in the contact hole CH1 is removed. Herein, the Cu alloy oxide film 10 is removed by cleaning treatment using a chelate cleaning solution. The cleaning solution and conditions used in the chelate cleaning may be similar to those of the embodiment described above. Thus, the contact hole CH1 exposes the surface of the drain electrode 7D (i.e., the surface of the upper layer 7U). A portion of the Cu alloy oxide film 10 that is located at the interface between the interlayer insulating layer 11 and the source/drain electrode 7 and the source line S remains unremoved.

Note that also in the present embodiment, chelate cleaning may etch (side etch) the Cu alloy oxide film 10 in the lateral direction (the direction parallel to the substrate 1) as described above with reference to FIG. 10(c). In such a case, as seen from the direction normal to the substrate 1, in the contact hole CH1, the edge portion of the Cu alloy oxide film 10 is located on the outer side with respect to the edge portion of the interlayer insulating layer 11 (the edge portion of the opening). Also in the present embodiment, chelate cleaning may remove not only the Cu alloy oxide film 10 but also a portion of the surface portion (Cu) of the main layer 7a, as described above with reference to FIG. 12. This reduces the irregularities produced on the surface of the upper layer 7U through the oxidation treatment, thereby flattening the contact surface.

Then, a transparent conductive film (not shown) is formed by a sputtering method, for example, in the contact hole CH1 and on the third insulating layer 17, and is patterned to form the transparent conductive layer 19. The transparent conductive layer 19 is in direct contact with the upper layer 7U of the drain electrode 7D in the contact hole CH1. Thus, the semiconductor device 200B is manufactured (see FIGS. 17(a) and 17(b)).

While a two-layer electrode structure is formed, in which the pixel electrode is the upper layer, with the method described above, the transparent conductive layer 19 functioning as a pixel electrode may be provided as the lower layer, and the common electrode 15 may be formed thereon with the third insulating layer 17 interposed therebetween. In such a case, as described in the embodiment above, after the interlayer insulating layer 11 is formed, the first insulating layer 12 may be etched (wet etched) using the second insulating layer 13 as a mask, thereby forming the contact hole CH1. Then, the Cu alloy oxide film 10 located on the bottom surface of the contact hole CH1 may be removed by chelate cleaning, thereby exposing the Cu alloy surface.

When manufacturing the semiconductor device 200A shown in FIG. 16, after the interlayer insulating layer 11 is formed, the contact hole CH1 may be formed in a portion of the interlayer insulating layer 11 that is located above the drain electrode 7D, thereby exposing the Cu alloy oxide film 10 on the bottom surface of the contact hole CH1. When an inorganic insulating layer is formed as the interlayer insulating layer 11, a resist mask may be formed on the inorganic insulating layer and the contact hole CH1 may be formed in the interlayer insulating layer 11 using the resist mask. When the first and second insulating layers 12 and 13 are formed as the interlayer insulating layer 11, the contact hole CH1 may be formed by etching the first insulating layer 12 using the second insulating layer 13 as a mask. After the formation of the contact hole CH1, chelate cleaning may be performed to expose the Cu alloy surface.

Note that when the first insulating layer 12 is etched using the second insulating layer 13 as a mask, there is no stripping of the resist mask, and the Cu alloy oxide film 10 located on the bottom surface of the contact hole CH1 is not thinned by a resist stripping solution. In such a case, if the Cu alloy oxide film 10 is removed by chelate cleaning, it is possible to more effectively reduce the contact resistance.

<Variations>

Other semiconductor devices of the present embodiment will now be described with reference to the drawings.

FIGS. 25(a) and 25(b) are a schematic cross-sectional view and a schematic plan view, respectively, showing the semiconductor device 200C according to the present embodiment. FIG. 25(a) shows a cross section taken along line IV-IV' of FIG. 25(b). In FIG. 25, like elements to those of FIG. 16 are denoted by like reference signs and will not be discussed below.

The semiconductor device 200C is different from the semiconductor device 200A shown in FIG. 16 in that the source/drain electrode 7 of the oxide semiconductor TFT 201 does not include a Cu alloy layer provided on the main layer 7a.

In the semiconductor device 200C, the Cu alloy oxide film 10 is arranged on the main layer 7a. The Cu alloy oxide film 10 may be formed in contact with the upper surface of the main layer 7a, for example. The Cu alloy oxide film 10 may be a sputtered film, for example. The Cu oxide film 8 and the metal oxide film 9 are arranged on the side surface of the main layer 7a and the side surface of the lower layer 7L, respectively. The Cu alloy oxide film 10 is removed in the contact hole CH1, and the transparent conductive layer 19 is in direct contact with the main layer 7a of the drain electrode 7D. The other elements are similar to those of the embodiment described above.

The semiconductor device 200C can be manufactured as follows, for example. First, the gate electrode 3, the gate insulating layer 4 and the oxide semiconductor layer 5 are formed by a method similar to that of the semiconductor devices 200A and 200B. Then, a source line metal film is formed by a sputtering method, for example. Herein, a metal film (e.g., a Ti film) to be the lower layer and a Cu film to be the main layer are formed in this order. Then, the Cu alloy oxide film 10 is formed on the source line metal film. The Cu alloy oxide film 10 may be formed by sputtering using a Cu alloy target in an oxygen-containing atmosphere (e.g., an Ar/O$_2$ atmosphere). Then, the source line metal film and the Cu alloy oxide film 10 are patterned using the same mask, thereby obtaining the source/drain electrode 7 and the source line S. The upper surfaces of these electrodes and lines are covered by the Cu alloy oxide film 10.

Then, an oxidation treatment is performed on the oxide semiconductor layer 5. This further oxidizes the surface portion of the Cu alloy oxide film 10, thereby a Cu alloy oxidization region (not shown) having a higher oxygen proportion than the main layer 7a side region of the Cu alloy oxide film 10. Since the side surface of the source/drain electrode 7 and the side surface of the source line S are not covered by the Cu alloy oxide film 10, they are exposed to the oxidation treatment. As a result, the Cu oxide film 8 is formed on the side surface of the main layer 7a of the source/drain electrode 7 and the source line S, and the Ti oxide film 9 is formed on the side surface of the lower layer 7L thereof.

Then, the interlayer insulating layer 11 is formed, and the contact hole CH1 is formed in the interlayer insulating layer 11, thereby exposing the Cu alloy oxide film 10. Then, by a method similar to the method described above, a portion of the Cu alloy oxide film 10 that is located on the bottom surface of the contact hole CH1 is removed by chelate cleaning, thereby exposing the surface of the drain electrode 7D (herein, the surface of the main layer 7a). Then, the transparent conductive layer 19 is provided on the interlayer insulating layer 11 and in the contact hole CH1 so as to be in contact with the drain electrode 7D. Thus, the semiconductor device 200C is manufactured.

Also with the semiconductor device 200C, advantageous effects similar to those described above are realized. That is, the Cu alloy oxide film 10 is arranged between the source/drain electrode 7 and the interlayer insulating layer 11 and is not arranged at the contact surface between the main layer 7a and the transparent conductive layer 19. Thus, it is possible to suppress the lowering of a device characteristic due to an increase in the contact resistance between the drain electrode 7D and the transparent conductive layer 19, while suppressing oxidization and discoloration of the main layer (Cu layer) 7a.

Since the upper surface of the source wiring layer is covered by the Cu alloy oxide film 10, thereby suppressing oxidization of Cu, it is possible to reduce the corrosion of an electrode due to oxidization and discoloration of Cu and reduce the alignment mark read error.

<Alignment Mark>

With the manufacturing process for the semiconductor devices 200A to 200C, an alignment mark may be provided on the substrate 1 for alignment of a mask. An alignment mark is formed using the same conductive film (source wiring layer) as the source/drain electrode 7, for example. The alignment mark is read based on the reflectance as the alignment mark is irradiated with light, for example.

Figure 26:
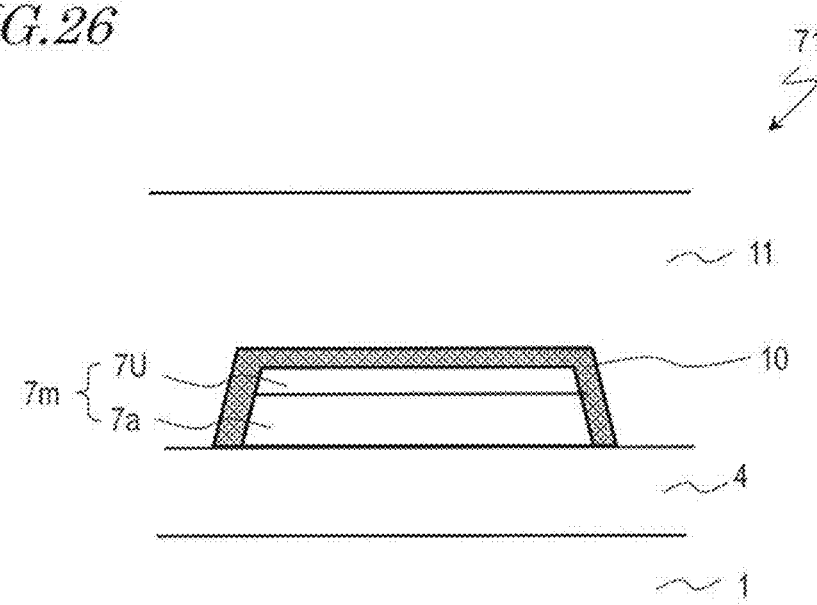
FIG. 26 A cross-sectional view illustrating an alignment mark portion 71 according to the second embodiment.

FIG. 26 is a cross-sectional view showing an example alignment mark portion 71 used in the present embodiment.

The alignment mark portion 71 includes the mark layer 7m formed by using the same conductive film as the source/drain electrode 7, for example. The mark layer 7m includes the main layer 7a whose main component is Cu, and the upper layer 7U including a Cu alloy. It may include a lower layer on the substrate 1 side of the main layer 7a. The interlayer insulating layer 11 is provided extending over the mark layer 7m. With the semiconductor devices 200A and 200B, the upper surface and the side surface of the mark layer 7m are covered by the Cu alloy oxide film 10. With the semiconductor device 200C, only the upper surface of the mark layer 7m is covered by the Cu alloy oxide film 10.

As described above, with a conventional semiconductor device using Cu wiring, a Cu oxide film is formed on the upper surface of the alignment mark through the oxidation treatment performed on the oxide semiconductor layer. Therefore, the irradiating light may possibly be diffused or absorbed due to oxidization and discoloration of Cu, resulting in an alignment mark read error. In contrast, in the present embodiment, since the upper surface of the mark layer 7m is covered by the Cu alloy oxide film 10, it is possible to suppress a read error due to oxidization and discoloration of Cu. It is advantageous because there is no need to provide an opening in the interlayer insulating layer 11 and remove an oxide film on the mark layer 7m as in the embodiment described above (FIG. 14). Therefore, it is possible to obtain the alignment mark portion 71 having a high readability without complicating the manufacturing process.

<Terminal Portion>

With the semiconductor devices 200A to 200C, a wiring layer including the source/drain electrode 7 (referred to as a source wiring layer) may include a layered structure as described above. The surface (the upper surface and the side surface) of the source wiring layer may be covered by the Cu alloy oxide film 10. In a contact portion of the source wiring layer that forms a contact with another conductive layer (referred to as an "additional contact portion"), it is preferred that the Cu alloy oxide film 10 is removed as with the contact portion between the drain electrode 7D and the transparent conductive layer 19 described above. Thus, it is possible to suppress in increase of the contact resistance. The additional contact portion may be a source terminal portion, a gate terminal portion or a source-gate connection layer, for example. These elements are similar to those of the embodiment described above.

The structure of a terminal portion will now be described using a gate terminal portion as an example. FIGS. 27(a) and 27(b) are a cross-sectional view and a plan view, respectively, illustrating a gate terminal portion. Like elements to those of FIG. 1 are denoted by like reference signs. FIG. 27(a) shows a cross section taken along line V-V' of FIG. 27(b).

A gate terminal portion 81 includes the gate connection layer 3t formed on the substrate 1, the gate insulating layer 4 provided extending over the gate connection layer 3t, the source connection layer 7t, the interlayer insulating layer 11 provided extending over the source connection layer 7t, and the upper conductive layer 19t formed in the contact hole CH2 formed in the interlayer insulating layer 11. The source connection layer 7t is formed from the same conductive film as the source line S, and is electrically separated from the source line S. The source connection layer 7t includes a Cu layer and a Cu alloy layer arranged on the Cu layer. The Cu alloy oxide film 10 is arranged on the upper surface of the source connection layer 7t. The Cu alloy oxide film 10 is arranged on the side surface of the Cu alloy layer of the source connection layer 7t, and the Cu oxide film 8 on the side surface of the Cu layer.

The Cu alloy oxide film 10 is removed in the contact hole CH2 formed in the interlayer insulating layer 11, and the upper conductive layer 19t is in direct contact with the upper surface (Cu alloy surface) of the source connection layer 7t. That is, the Cu alloy oxide film 10 is present interposed between the source connection layer 7t and the interlayer insulating layer 11, and is not present interposed between the source connection layer 7t and the upper conductive layer 19t. Thus, it is possible to suppress the contact resistance between the gate connection layer 3t and the upper conductive layer 19t.

The gate terminal portion 81 can be manufactured as follows. First, a source wiring layer including the gate line G, the gate insulating layer 4, an oxide semiconductor layer (not shown) and the source connection layer 7t is formed. The source connection layer 7t is arranged so as to be in contact with the gate line G in the opening of the gate insulating layer 4. Then, an oxidation treatment is performed on the oxide semiconductor layer. In this process, the surface of the source connection layer 7t is oxidized, thereby forming the Cu alloy oxide film 10 and the Cu oxide film 8. Then, the interlayer insulating layer 11 covering the source wiring layer is formed, and the contact hole CH2 through which the Cu alloy oxide film 10 is exposed is provided in the interlayer insulating layer 11. Then, a portion of the Cu alloy oxide film 10 that is exposed through the contact hole CH2 is removed by chelate cleaning, or the like. Then, the upper conductive layer 19t is provided in the contact hole CH2 so as to be in contact with the source connection layer 7t.

Third Embodiment

A third embodiment of a semiconductor device according to the present invention will be described with reference to the drawings.

The present embodiment is different from the semiconductor device 100A shown in FIG. 1 in that the Cu alloy oxide film 10 is formed on the main layer 7a of the source/drain electrode 7 without forming the upper layer 7U.

Figure 28:
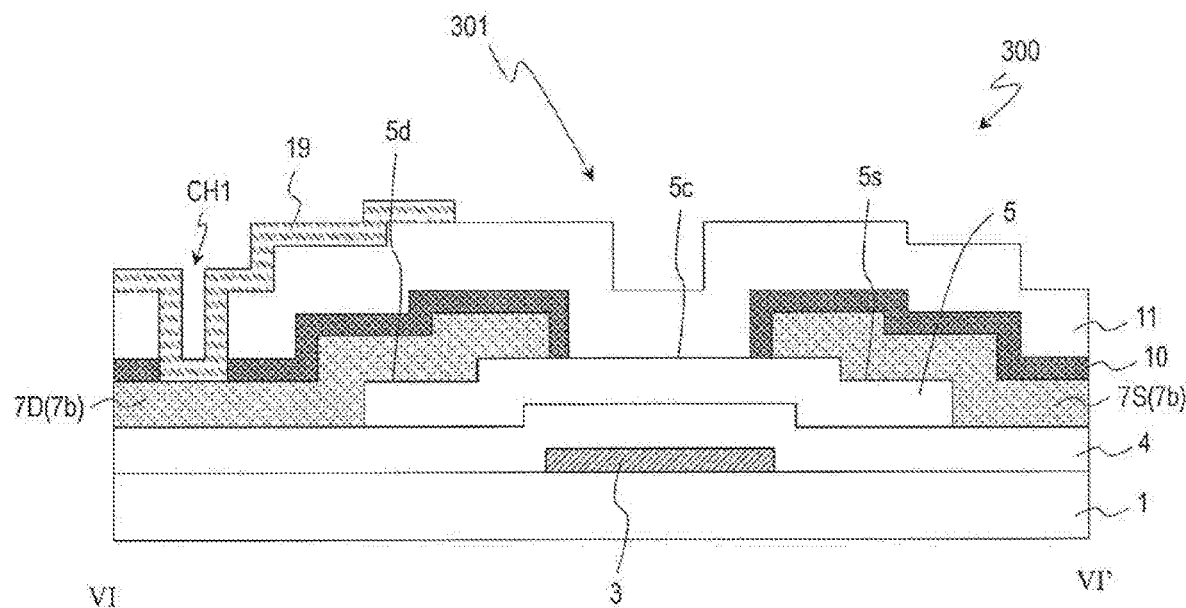
FIG. 28 A cross-sectional view illustrating a semiconductor device 300 of a third embodiment.

FIG. 28 is a cross-sectional view illustrating a semiconductor device 300 of the present embodiment.

An oxide semiconductor TFT 301 of the semiconductor device 300 includes a Cu alloy layer 7b as the main layer of the source/drain electrode 7. The Cu alloy oxide film 10 is formed between the source/drain electrode 7 and the interlayer insulating layer 11. The Cu alloy oxide film 10 is removed in the contact hole CH1 provided in the interlayer insulating layer 11, and the transparent conductive layer 19 is in direct contact with the Cu alloy layer 7b. The other elements are similar to those of the semiconductor device 100A.

The Cu alloy layer 7b is only required to include a Cu alloy, and may include impurities. A metal element that by nature is more likely to be oxidized than Cu may be included as the additive metal element of the Cu alloy. For example, at least one metal element selected from the group consisting of Mg, Al, Ca, Ti, Mo and Mn may be included as the additive metal element. Then, it is possible to more effectively suppress oxidization of Cu. The proportion of the additive metal element to the Cu alloy (when two or more additive metal elements are included, the proportions of the additive metal elements) may be similar to the proportion of the additive metal element of the upper layer 7U in the second embodiment described above.

The Cu alloy oxide film 10 may be an oxide film formed through oxidization of the surface of the Cu alloy layer 7b during the oxidation treatment performed on the oxide semiconductor layer 5. The Cu alloy oxide film 10 may be arranged on the upper surface and the side surface of the Cu alloy layer 7b.

The semiconductor device 300 also realizes advantageous effects similar to those of the first and second embodiments.

The Cu alloy oxide film 10 is arranged between the source/drain electrode 7 and the interlayer insulating layer 11 and is not arranged between the Cu alloy layer 7b and the transparent conductive layer 19. Thus, it is possible to suppress the lowering of a device characteristic due to an increase in the contact resistance between the drain electrode 7D and the transparent conductive layer 19. By performing chelate cleaning, it is possible to reduce the irregularities on the contact surface, and it is therefore possible to suppress variations of the contact resistance.

The semiconductor device 300 may be manufactured by a method similar to that of the semiconductor device 100A, for example. Note however that a Cu alloy film is used as the source line metal film. Also, during the oxidation treatment of the oxide semiconductor layer 5, the surface of the Cu alloy film is oxidized, thereby forming the Cu alloy oxide film 10.

The source/drain electrode 7 may further include a Ti- or Mo-containing lower layer on the substrate 1 side of the Cu alloy layer 7b. The Cu alloy layer 7b may have a layered structure including two or more Cu alloy layers having different compositions. For example, a first alloy layer and a second alloy layer having a higher resistance than the first alloy layer may be provided in this order from the substrate side. In such a case, the low-resistance first alloy layer functions as the main layer, and the surface of the second alloy layer is oxidized, thereby forming the Cu alloy oxide film 10.

The present invention is not limited to the first to third embodiments described above. The source/drain electrode 7 is only required to include a Cu-containing layer. The Cu-containing layer may be a Cu layer or a Cu alloy layer, or may be a layer that has a lower Cu content than these layers. It is only required that a Cu-containing metal oxide film (referred to as a "copper-containing metal oxide film") is formed between the source/drain electrode 7 and the interlayer insulating layer 11. The copper-containing metal oxide film includes CuO, for example. The copper-containing metal oxide film may be a Cu oxide film or a Cu alloy oxide film. Alternatively, it may be another Cu-containing oxide film. The interlayer insulating layer 11 is arranged so as to be in contact with at least the channel region of the oxide semiconductor layer 5 and to cover the drain electrode 7D with the copper-containing metal oxide film interposed therebetween. The transparent conductive layer 19 is arranged in the contact hole CH1 so as to be in direct contact with the drain electrode 7D without the copper-containing metal oxide film interposed therebetween. With such a configuration, it is possible to reduce the contact resistance between the drain electrode 7D and the transparent conductive layer 19 while maintaining the TFT characteristics.

Each of the oxide semiconductor TFTs 101, 201 and 301 described above includes the gate electrode 3 arranged on the substrate 1 side of the oxide semiconductor layer 5 (bottom gate structure), but the gate electrode 3 may be arranged above the oxide semiconductor layer 5 (top gate structure). With the oxide semiconductor TFTs, the source and drain electrodes are in contact with the upper surface of the oxide semiconductor layer 5 (top contact structure), they may be in contact with the lower surface of the oxide semiconductor layer 5 (bottom contact structure).

The present embodiment is suitably applicable to active matrix substrates using oxide semiconductor TFTs. Active matrix substrates can be used in various display devices such as liquid crystal display devices, organic EL display devices and inorganic EL display devices, and electronic devices including display devices, etc. On an active matrix substrate, oxide semiconductor TFTs can be used not only as switching elements provided in pixels but also as circuit elements of peripheral circuits such as drivers (monolithicization). In such a case, oxide semiconductor TFTs of the embodiment of the present invention, which use an oxide semiconductor layer having a high mobility (e.g., 10 $cm^2/Vs$ or more) as the active layer, can suitably be used as circuit elements.

INDUSTRIAL APPLICABILITY

The embodiment of the present invention is widely applicable to oxide semiconductor TFTs and various semiconductor devices including oxide semiconductor TFTs. For example, it is applicable to circuit boards such as active matrix substrates, display devices such as liquid crystal display devices, organic electroluminescence (EL) display devices, inorganic electroluminescent display devices and MEMS display devices, image pickup devices such as image sensor devices, and various electronic devices such as image input devices, fingerprint reader devices and semiconductor memory devices.

REFERENCE SIGNS LIST

1 Substrate
3 Gate electrode
4 Gate insulating layer
5 Oxide semiconductor layer (active layer)
5s Source contact region
5d Drain contact region
5c Channel region
7S Source electrode
7D Drain electrode
7a Main layer
7U Upper layer
7L Lower layer
8 Cu oxide film
9 Metal oxide film
10 Cu alloy oxide film
11 Interlayer insulating layer
12 First insulating layer
13 Second insulating layer
15 Common electrode
17 Third insulating layer
19 Transparent conductive layer (pixel electrode)
101, 201, 301 Oxide semiconductor TFT
100A, 100B, 200A, 200B, 200C, 300 Semiconductor device
CH1, CH2 Contact hole

The invention claimed is:

1. A method for manufacturing a semiconductor device, the method comprising steps of:
(A) forming a thin film transistor by forming, on a substrate, a gate electrode, a gate insulating layer, an oxide semiconductor layer, and forming a source electrode and a drain electrode including copper by forming a source line metal film including copper on the gate insulating layer and the oxide semiconductor layer and then patterning the source line metal film;
(B) forming an oxide film including copper on an upper surface and on at least one of a portion of a side surface of the source electrode and the drain electrode, the oxide film being a copper oxide film or a copper alloy oxide film including copper and at least one metal element other than copper;
(C) forming an interlayer insulating layer after the step (B), the interlayer insulating layer covering the thin film transistor and being in contact with the oxide film and a channel region of the oxide semiconductor layer;

(D) forming a first contact hole in a portion of the interlayer insulating layer that is located over the drain electrode, thereby exposing a portion of the oxide film in the first contact hole;

(E) removing the exposed portion of the oxide film by using a chelate cleaning method, thereby exposing a portion of the drain electrode in the first contact hole; and (F) forming a transparent conductive layer on the interlayer insulating layer and in the first contact hole, the transparent conductive layer being in direct contact with the exposed portion of the drain electrode in the first contact hole.

2. The method for manufacturing a semiconductor device according to claim 1, wherein:

the source electrode and the drain electrode include a copper layer or a copper alloy layer, the copper alloy layer including copper and the at least one metal element other than copper, and the step (B) includes performing an oxidation treatment on at least one portion of the oxide semiconductor layer that is to be the channel region, thereby increasing an oxygen concentration of a surface of the at least one portion to be the channel region and oxidizing a surface of the source electrode and the drain electrode to form the oxide film.

3. The method for manufacturing a semiconductor device according to claim 1, wherein the step (B) includes forming the oxide film on the source electrode and the drain electrode using a sputtering method.

4. The method for manufacturing a semiconductor device according to claim 1, wherein:

the source electrode and the drain electrode include a copper layer and a copper alloy layer arranged on the copper layer, the copper alloy layer including copper and the at least one metal element other than copper; and the step (B) includes performing an oxidation treatment on at least one portion of the oxide semiconductor layer that is to be the channel region, thereby increasing an oxygen concentration of a surface of the at least one portion to be the channel region and oxidizing a surface of the copper alloy layer of the source electrode and the drain electrode to form the copper alloy oxide film.

5. The method for manufacturing a semiconductor device according to claim 1, wherein, in the step (E), not only the exposed portion of the oxide film but also a surface portion of the drain electrode are removed by the chelate cleaning method.

6. The method for manufacturing a semiconductor device according to claim 1, wherein the oxide film is the copper oxide film.

7. The method for manufacturing a semiconductor device according to claim 1, wherein the oxide film is the copper alloy oxide film.

8. The method for manufacturing a semiconductor device according to claim 1, wherein the thin film transistor has a channel-etched structure.

9. The method for manufacturing a semiconductor device according to claim 1, wherein the oxide semiconductor layer includes an In—Ga—Zn—O-based semiconductor.

10. The method for manufacturing a semiconductor device according to claim 9, wherein the oxide semiconductor layer includes a crystalline portion.

11. The method for manufacturing a semiconductor device according to claim 1, wherein:

the source electrode and the drain electrode include a copper layer and a copper alloy layer arranged on the copper layer, the copper alloy layer including copper and the at least one metal element other than copper, and in the step (B), the oxide film including copper is formed on an upper surface of the copper alloy layer and on at least side surfaces of the copper layer and the copper alloy layer.

* * * * *